(12) United States Patent
Lim et al.

(10) Patent No.: US 11,903,197 B2
(45) Date of Patent: Feb. 13, 2024

(54) SEMICONDUCTOR DEVICE

(71) Applicant: SAMSUNG ELECTRONICS CO., LTD., Suwon-si (KR)

(72) Inventors: Suhwan Lim, Hanam-si (KR); Jaehun Jung, Seongnam-si (KR); Sanghoon Kim, Hwaseong-si (KR); Taehun Kim, Gwacheon-si (KR); Seongchan Lee, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 274 days.

(21) Appl. No.: 17/148,334

(22) Filed: Jan. 13, 2021

(65) Prior Publication Data
US 2022/0005826 A1    Jan. 6, 2022

(30) Foreign Application Priority Data
Jul. 2, 2020 (KR) .......................... 10-2020-0081358

(51) Int. Cl.
| | |
|---|---|
| H10B 43/27 | (2023.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ............. *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ......... H01L 27/11582; H01L 27/11578; H01L 27/1158
See application file for complete search history.

(56) References Cited

U.S. PATENT DOCUMENTS

| | | | |
|---|---|---|---|
| 9,613,980 B2 | 4/2017 | Yamada et al. | |
| 9,837,165 B2 | 12/2017 | Lee et al. | |
| 9,887,207 B2 | 2/2018 | Zhang et al. | |
| 9,916,901 B1 | 3/2018 | Saito et al. | |
| 10,600,487 B2 | 3/2020 | Nam et al. | |
| 10,629,613 B1* | 4/2020 | Shimizu | H01L 23/5226 |
| 2016/0035741 A1* | 2/2016 | Tajima | H10B 43/35 |
| | | | 257/324 |
| 2018/0006055 A1 | 1/2018 | Kim et al. | |

(Continued)

*Primary Examiner* — Christopher A Johnson
(74) *Attorney, Agent, or Firm* — Myers Bigel, P.A.

(57) ABSTRACT

A semiconductor device includes gate electrodes and insulating layers spaced apart from each other on a substrate and alternately stacked in a direction perpendicular to an upper surface of the substrate, and channel structures that extend through stack structures. Ones of the structures include a channel insulating layer, a pad layer on the channel insulating layer, and a channel layer. The channel layer includes a first channel region, and a second channel region including a semiconductor material having a length shorter than a length of the first channel region and having an impurity concentration of a first conductivity type and the pad layer includes a semiconductor material doped with a second conductivity type impurity. A height level of a lower surface of the second channel region is lower than a height level of a lower surface of a first erase gate electrode.

20 Claims, 20 Drawing Sheets

(56) References Cited

U.S. PATENT DOCUMENTS

2019/0393242 A1* 12/2019 Kim .................. H01L 27/11524
2020/0020717 A1 1/2020 Lee et al.
2020/0365614 A1* 11/2020 Kim .................. H01L 27/11556

* cited by examiner

SEMICONDUCTOR DEVICE

CROSS-REFERENCE TO RELATED APPLICATION(S)

This application claims benefit of priority to Korean Patent Application No. 10-2020-0081358 filed on Jul. 2, 2020 in the Korean Intellectual Property Office, the disclosure of which is incorporated herein by reference in its entirety.

BACKGROUND

The present inventive concept relates to a semiconductor device.

Recently, a vertically stacked NAND (a vertical NAND, abbreviated as VNAND) memory device is being developed to have a cell-on-periphery (COP) structure in which peripheral circuits are located below a memory cell array. In the COP structure, a gate-induced drain leakage current (GIDL current) may be used to supply holes required for an erase operation to a channel. However, as the number of layers of the VNAND structure increases, there may be a problem in the erase operation using the GIDL current. Therefore, there may be a need to improve efficiency of the GIDL current.

SUMMARY

Some embodiments of the present inventive concept relate to providing semiconductor device having improved efficiency of a GIDL current.

According to some embodiments of the present inventive concept, a semiconductor device includes gate electrodes spaced apart from each other on a substrate and stacked in a direction, perpendicular to an upper surface of the substrate, insulating layers alternately stacked with the gate electrodes, and channel structures that extend through the gate electrodes and the insulating layers, wherein ones of the channel structures include a channel insulating layer, a pad layer on the channel insulating layer, and a channel layer on a side surface of the channel insulating layer and on at least a portion of a side surface of the pad layer, wherein the channel layer includes a first channel region and a length of the second channel region is shorter than a length of the first channel region, wherein the second channel region includes a semiconductor material doped with a first conductivity type impurity, the first channel region includes a semiconductor material having an impurity concentration lower than an impurity concentration in the second channel region, and the pad layer includes a semiconductor material doped with a second conductivity type impurity that is different from the first conductivity type impurity, and a height level of a lower surface of the second channel region is lower than a height level of a lower surface of a first erase gate electrode that is in an uppermost portion of the gate electrodes.

According to some embodiments of the present inventive concept, a semiconductor device includes gate electrodes spaced apart from each other on a substrate and stacked in a direction, perpendicular to an upper surface of the substrate, and channel structures that extend through the gate electrodes, wherein ones of the channel structures include a channel insulating layer, a pad layer on the channel insulating layer, and a channel layer on a side surface of the channel insulating layer and on at least a portion of a side surface of the pad layer, wherein the channel layer includes a first channel region on the side surface of the channel insulating layer, and a second channel region disposed on the first channel region, wherein the second channel region includes a semiconductor material doped with a first conductivity type impurity, the first channel region includes a semiconductor material having an impurity concentration lower than an impurity concentration in the second channel region, and the pad layer includes a semiconductor material doped with a second conductivity type impurity that is different from the first conductivity type impurity.

According to some embodiments of the present inventive concept, a semiconductor device includes gate electrodes spaced apart from each other on a substrate and stacked in a first direction, perpendicular to an upper surface of the substrate, a conductive layer between the substrate and the gate electrodes, channel structures extending in the first direction, that extend through the gate electrodes, and extend into at least a portion of the substrate, and a separation region that extend through the gate electrodes and extends in the first direction, wherein ones of the channel structures include a channel insulating layer, a pad layer on the channel insulating layer, and a channel layer on a side surface of the channel insulating layer and on at least a portion of a side surface of the pad layer, the conductive layer is in contact with the channel layer of ones of the channel structures in a direction, parallel to the upper surface of the substrate, the channel layer includes a first channel region, and a second channel region overlapping at least a portion of the pad layer in a direction, parallel to the upper surface of the substrate, and at least a portion of the second channel region overlaps an erase gate electrode that is in an uppermost portion of the gate electrodes in a direction, parallel to the upper surface of the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the accompanying drawings.

Figure 1:
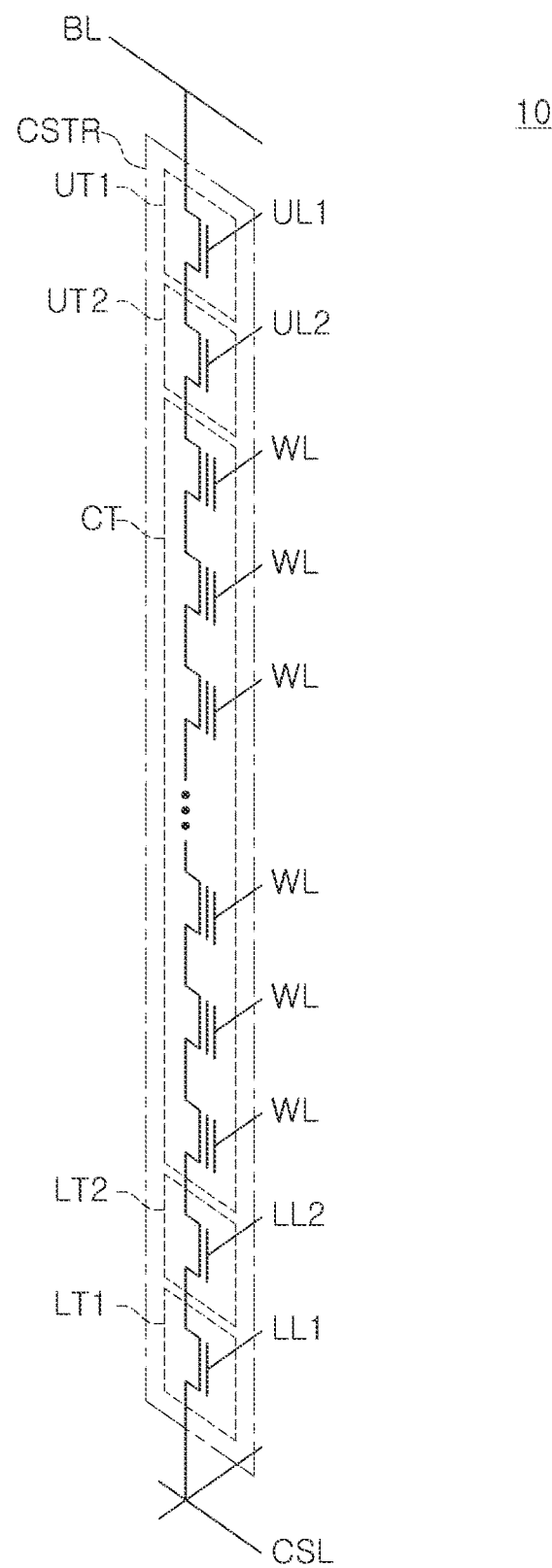
FIG. 1 is a schematic circuit diagram of a semiconductor device according to some embodiments of the present inventive concept.

FIG. 1 is a schematic circuit diagram of a semiconductor device according to some embodiments of the present inventive concept.

Referring to FIG. 1, a semiconductor device 10 may include a plurality of bit lines BL, a common source line CSL, a plurality of word lines WL, upper gate lines UL1 and UL2, lower gate lines LL1 and LL2, and a plurality of memory cell strings CSTR.

Each of the plurality of memory cell strings CSTR may be connected to each of the plurality of bit lines BL and the common source line CSL. Each of the memory cell strings CSTR may include at least one or more lower transistors LT1 and LT2 adjacent to the common source line CSL, at least one or more upper transistors UT1 and UT2 adjacent to each of the plurality of bit lines BL, and a plurality of memory cell transistors CT disposed between the lower transistors LT1 and LT2 and the upper transistors UT1 and UT2.

The at least one or more lower transistors LT1 and LT2, the plurality of memory cell transistors CT, and the at least one or more upper transistors UT1 and UT2 may be connected in series, in each of the plurality of memory cell strings CSTR.

In a semiconductor device 10 according to some embodiments of the present inventive concept, the upper transistors UT1 and UT2 may include an upper erase control transistor UT1 and a string select transistor UT2. The lower transistors LT1 and LT2 may include a lower erase control transistor LT1 and a ground select transistor LT2.

In a semiconductor device 10 according to some embodiments of the present inventive concept, the upper gate lines UL1 and UL2 may include a first upper gate line UL1 and a second upper gate line UL2. Similarly, the lower gate lines LL1 and LL2 may include a first lower gate line LL1 and a second lower gate line LL2.

The first lower gate line LL1 may be connected to a gate electrode of the lower erase control transistor LT1, and the second lower gate line LL2 may be connected to a gate electrode of the ground select transistor LT2. Similarly, the first upper gate line UL1 may be connected to a gate electrode of the upper erase control transistor UT1, and the second upper gate line UL2 may be connected to a gate electrode of the string select transistor UT2. The plurality of word lines WL may be respectively connected to gate electrodes of the memory cell transistors CT.

In a semiconductor device 10 according to some embodiments of the present inventive concept, when information stored in the memory cell transistors CT is erased, a gate-induced drain leakage (GIDL) current generated in the lower and upper erase control transistors LT1 and UT1 may be used to perform the erase operation.

For example, during an erase operation, an erase voltage may be applied to the bit line BL, and a voltage lower than the erase voltage may be applied to the erase gate electrode of the upper erase control transistor UT1 connected to the first upper gate line UL1. In this case, a depletion region may be formed in a portion in which a gate region and a drain region of the upper erase control transistor UT1 overlap, and an electron-hole pair may be formed in the depletion region. Among the formed electron-hole pair, an electron may move toward the drain region by BAND-to-BAND tunneling, and a hole may move toward a channel region to increase a channel voltage, to enable the erase operation. The GIDL current may be defined as a current that occurs during the above process to enable the erase operation.

A semiconductor device 10 according to some embodiments of the present inventive concept may intentionally generate a GIDL current during the erase operation. A hole may be injected into a channel of the memory cell transistors CT from an electron-hole pair generated in a process of generating the GIDL current. Therefore, an electron trapped in an information storage layer of each of the memory cell transistors CT may be moved by the intentionally generated GIDL current, or the hole in the channel may be trapped in the information storage layer, to perform an erase operation of data stored in the memory cell transistors CT.

Figure 2:
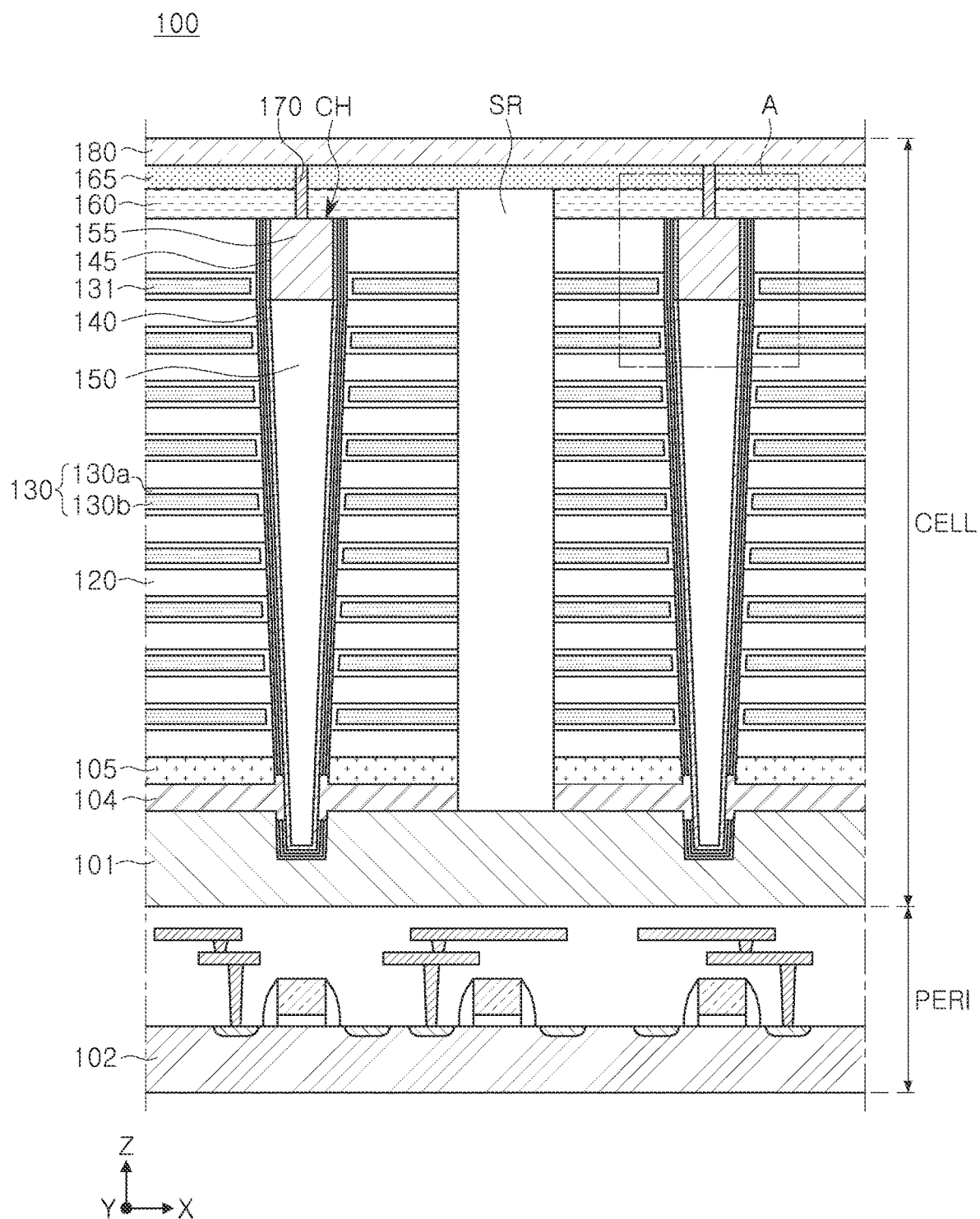
FIG. 2 is a schematic plan view of a semiconductor device according to some embodiments of the present inventive concept.

FIG. 2 is a schematic plan view of a semiconductor device according to some embodiments of the present inventive concept.

Referring to FIG. 2, a semiconductor device 100 according to some embodiments of the present inventive concept may include a cell region CELL in which data is stored, and a peripheral circuit region PERI disposed below the cell region CELL.

In a semiconductor device 100 according to some embodiments of the present inventive concept, the cell region CELL may include a substrate 101, a plurality of insulating layers 120, a plurality of gate electrodes 130, channel structures CH, and a separation region SR.

As an example, the cell region CELL further may include a first conductive layer 104 and a second conductive layer 105, arranged between the insulating layers and gate electrodes 120 and 130 and the substrate 101. In addition, the cell region CELL of the semiconductor device 100 may further include a first interlayer insulating layer 160, a second interlayer insulating layer 165, a contact plug 170 electrically connected to the channel structures CH, and a bit line 180 electrically connected to the contact plug 170.

The peripheral circuit region PERI may include a base substrate 102, and circuit elements arranged on the base substrate 102 and used for driving and controlling a memory cell, circuit contact plugs, and circuit wiring lines. For example, circuit elements included in the peripheral circuit region PERI may include planar transistors. Each of the circuit elements may include a circuit gate dielectric layer, a spacer layer, and a circuit gate electrode, and source/drain regions that may be disposed on both sides of the circuit gate electrode and in the base substrate 102.

In a semiconductor device 100 according to some embodiments of the present inventive concept, after first manufacturing the peripheral circuit region PERI, the substrate 101 of the memory cell region CELL may be formed on the peripheral circuit region PERI. The substrate 101 may be formed to have a size, equal to a size of the base substrate 102 of the peripheral circuit region PERI, or may be formed to have a size, smaller than the size of the base substrate 102. The memory cell region CELL and the peripheral circuit region PERI may be connected to each other in a region not illustrated. For example, the gate electrodes 130 may extend in a Y-axis direction, and may be electrically connected to circuit elements of the peripheral circuit region PERI in at least some regions.

In a semiconductor device 100 according to some embodiments of the present inventive concept, the substrate 101 may have an upper surface extending in an X-axis direction and the Y-axis direction. The substrate 101 may include a semiconductor material, such as a group IV semiconductor, a group MN compound semiconductor, or a group II-VI oxide semiconductor. For example, the group IV semiconductor may include silicon, germanium, or silicon-germanium. A configuration of the substrate 101 is not limited thereto, and the substrate 101 may be provided as a bulk wafer, an epitaxial layer, a silicon-on-insulator (SOL) layer, a semiconductor-on-insulator (SeOI) layer, or the like.

A semiconductor device 100 according to some embodiments of the present inventive concept may include the insulating layers 120 and the gate electrodes 130, alternately stacked on the substrate 101 in a Z-axis direction, perpendicular to the upper surface of the substrate 101. The insulating layers 120 may include an insulating material such as silicon oxide or silicon nitride. For example, an insulating layer located in an uppermost portion of the insulating layers 120 may be thicker than other insulating layers. The gate electrodes 130 may extend to have different lengths on at least one region of the substrate 101. In other words, the channel structure CU may have a smaller width closer to the substrate 101 such that the gate electrodes 130 closer to the substrate have a greater length in a X-axis direction.

In a semiconductor device 100 according to some embodiments of the present inventive concept, the gate electrodes 130 may include at least one lower gate electrode, at least one upper gate electrode, and intermediate gate electrodes between the lower gate electrode and the upper gate electrode.

Referring to the semiconductor device 10 illustrated in FIG. 1 together, the lower gate electrodes may correspond to the lower gate lines LL1 and LL2, and the upper gate electrodes may correspond to the upper gate lines UL1 and UL2. For example, the upper gate electrodes may include a first upper gate electrode 131, and a second upper gate electrode disposed below and spaced apart from the first upper gate electrode 131.

The first upper gate electrode 131 may correspond to the first upper gate line UL1 of FIG. 1. For example, the first upper gate line UL1 may be connected to the gate electrode of the upper erase control transistor UT1, and the first upper gate electrode 131 may be an erase gate electrode.

At least a portion of the intermediate gate electrodes may correspond to some of the word lines WL illustrated in FIG. 1. Remaining portions of the intermediate gate electrodes may be dummy gate electrodes. For example, the number of the intermediate gate electrodes may be determined according to capacitance of a semiconductor device 100 according to some embodiments of the present inventive concept.

Each of the gate electrodes 130 may include a first gate layer 130*a* and a second gate layer 130*b*. For example, the first gate layer 130*a* may include tungsten nitride (WN), tantalum nitride (TaN), titanium nitride (TiN), or a combination thereof. In addition, the second gate layer 130*b* may include a metallic material such as tungsten (W). A configuration of the gate electrodes 130 is not limited thereto, and the gate electrodes 130 may be formed of a plurality of layers of three (3) or more, and may include polycrystalline silicon or a metal silicide material, according to some embodiments.

In a semiconductor device 100 according to some embodiments of the present inventive concept, the separation region SR may extend in a direction, perpendicular to the upper surface of the substrate 101, and may pass through the gate electrodes 130 and the insulating layer 120, alternately stacked. The separation region SR may extend in the Y-axis direction, parallel to the upper surface of the substrate 101.

The separation region SR may include an insulating material, for example, silicon oxide or the like. For example, the gate electrodes 130 may be separated and disposed in a direction, parallel to the upper surface of the substrate 101 by the separation region SR. The gate electrodes 130 disposed between the plurality of separation regions SR may constitute a single memory block. This example arrangement is illustrative, and a definition of a single memory block is not limited thereto.

Each of the channel structures CH may disposed to extend in the Z-axis direction, perpendicular to the upper surface of the substrate 101, pass through the gate electrodes 130 and the insulating layers 120, and pass through at least a portion of the substrate 101. The channel structures CH may be disposed to be spaced apart from each other in a direction, parallel to the upper surface of the substrate 101, while forming rows and columns on the substrate 101. For example, the channel structures CH may be disposed to have a grid form, or may be disposed to have a zigzag form in one direction. Each of the channel structures CH may have a side surface, perpendicular to the upper surface of the substrate 101, or may have a columnar shape having an inclined side surface that becomes narrower as the channel structure CH approaches the substrate 101, depending on an aspect ratio. The channel structures CH may be separated from one another in the X-axis direction by the separation region SR.

In a semiconductor device 100 according to some embodiments of the present inventive concept, each of the channel structures CH may include a channel layer 145, a channel insulating layer 150, and a pad layer 155. For example, each of the channel structures CH may further include a gate dielectric layer 140 disposed between the channel layer 145 and the gate electrodes 130.

The channel layer 145 may be formed to have an annular shape surrounding the channel insulating layer 150 in the channel structures CH, but according to some embodiments, a columnar shape such as a cylinder or a prism may be formed without the channel insulating layer 150. The channel layer 145 may be directly connected to the substrate 101 below each of the channel structures CH. A portion of the gate dielectric layer 140 may be removed from a lower portion of each of the channel structures CH, and the channel layer 145 may be connected to the first conductive layer 104 in the removed portion.

In a semiconductor device 100 according to some embodiments of the present inventive concept, the channel layer 145 may include a semiconductor material such as polycrystalline silicon or single crystal silicon. The semiconductor material included in the channel layer 145 may not be doped with impurities or may be doped with a p-type impurity or an n-type impurity. The channel layer 145 may be divided into a plurality of regions, according to an impurity concentration and/or a manufacturing method. The impurity concentration and manufacturing method of each of the plurality of regions of the channel layer 145 will be described later.

Referring to the semiconductor device 10 illustrated in FIG. 1 together, in a semiconductor device 100 according to some embodiments of the present inventive concept, a single memory cell string CSTR may be formed around the channel layer 145. In addition, a plurality of memory cell strings CSTR may be arranged in columns and rows in the X-axis direction and the Y-axis direction.

The channel structures CH disposed in the same position in the X-axis direction may be respectively connected to different bit lines 180 by arrangement of an upper wiring structure connected to the pad layer 155 through a contact plug 170. For example, at least a portion of the channel structures CH disposed in the same position in the Y-axis direction may be connected to the same bit line 180. According to embodiments, a portion of the channel structures CH may be dummy channels, not connected to the bit line 180.

The pad layer 155 may be disposed on the channel insulating layer 150 in the channel structures CH. The pad layer 155 may be disposed on a side surface of the channel layer 145 to be electrically connected to the channel layer 145. Arrangement of the pad layer 155 is not limited thereto. In a semiconductor device 100 according to some embodiments of the present inventive concept, the pad layer 155 may be disposed to be electrically connected to an upper surface of the channel layer 145. For example, the pad layer 155 may include doped polycrystalline silicon.

A gate electrode 131 located in an uppermost portion of the gate electrodes 130 may be the first erase gate electrode 131, and at least a portion of the pad layer 155 may be surrounded by the first erase gate electrode 131 in a direction, parallel to the upper surface of the substrate 101. For example, at least a portion of the pad layer 155 may overlap the first erase gate electrode 131 in a direction, parallel to the upper surface of the substrate 101.

A semiconductor device 100 according to some embodiments of the present inventive concept may intentionally generate a GIDL current by overlapping of at least a portion of the pad layer 155 and the first erase gate electrode 131. The intentionally generated GILL current may be used for an erase operation of the semiconductor device 100. The pad layer 155 and the first erase gate electrode 131 may overlap each other in a direction, perpendicular to the upper surface of the substrate 101 by a thickness of the first erase gate electrode 131. For example, the thickness of the first erase gate electrode 131 may be about 25 nm. The present inventive concept is not limited thereto, and a thickness to be overlapped may be less than the thickness of the first erase gate electrode 131.

In a semiconductor device 100 according to some embodiments of the present inventive concept, the gate dielectric layer 140 may be disposed between the gate electrodes 130 and the channel layer 145. The gate dielectric layer 140 may include a plurality of layers for trapping electric charges. The present inventive concept is not limited to the embodiments illustrated in the drawings, and the shape may be changed as necessary.

The first conductive layer 104 and the second conductive layer 105 may be sequentially stacked on the upper surface of the substrate 101. At least a portion of the first conductive layer 104 and the second conductive layer 105 may function as a common source line in a semiconductor device 100 according to some embodiments of the present inventive concept. The first conductive layer 104 may be electrically connected to the channel layer 145 through a region from which the gate dielectric layer 140 has been removed, in the lower portion of the channel structures CH.

The first conductive layer 104 and the second conductive layer 105 may include a semiconductor material, and for example, may include polycrystalline silicon. For example, at least the first conductive layer 104 may be doped with an impurity, and the second conductive layer 105 may be doped with an impurity, or may include an impurity diffused from the first conductive layer 104.

The first interlayer insulating layer 160 and the second interlayer insulating layer 165 may cover or overlap the insulating layers 120 and the gate electrodes 130 in a direction perpendicular to the substrate, and may include an insulating material such as silicon oxide or the like. The contact plug 170 may pass through the first interlayer insulating layer 160 and the second interlayer insulating layer 165, and may electrically connect the bit lines 180 disposed on the second interlayer insulating layer 165, and ones of the pad layers 155 of the channel structures CR The bit line 180 illustrated in FIG. 2 may correspond to the bit line BL illustrated in the circuit diagram of FIG. 1.

Figure 3:
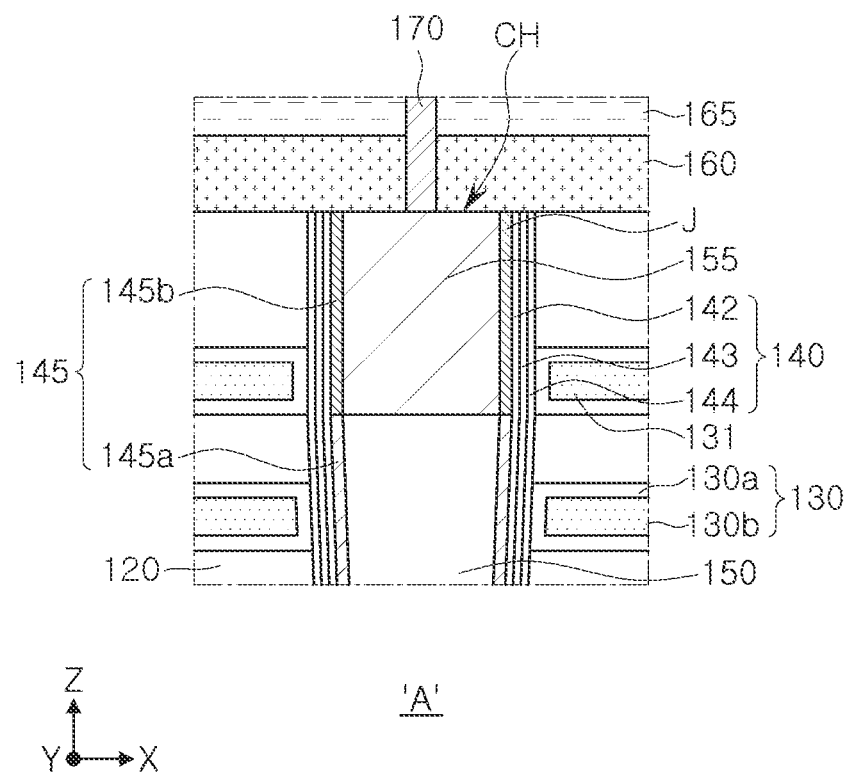
FIG. 3 is a partially enlarged view of a semiconductor device according to some embodiments of the present inventive concept.

FIG. 3 is a partially enlarged view of a semiconductor device according to some embodiments of the present inventive concept.

Referring to FIG. 3, in a semiconductor device 100 according to some embodiments of the present inventive concept, channel structures CH may include a gate dielectric layer 140 including a plurality of layers, a channel layer 145 divided into a plurality of regions, a channel insulating layer 150, and a pad layer 155. The partially enlarged view illustrated in FIG. 3 may be a portion A of the semiconductor device 100 illustrated in FIG. 2.

The gate dielectric layer 140 may include a tunneling layer 142, a charge storage layer 143, and a blocking layer 144, in sequence, starting from a layer adjacent to the channel layer 145. The tunneling layer 142 and the charge storage layer 143 may extend in a direction, perpendicular to an upper surface of a substrate 101, in a similar manner to the channel layer 145, and the blocking layer 144 may be disposed to surround at least a portion of gate electrodes 130. The gate dielectric layer 140 may be disposed to extend into the substrate 101, as illustrated in FIG. 2.

For example, the blocking layer 144 may extend to surround side surfaces of the gate electrodes 130 and side surfaces of insulating layers 120. A structure of the blocking layer 144 is not limited thereto, and may extend between the insulating layers 120 and a first gate layer 130a. The blocking layer 144 may be disposed to surround only a portion of the gate electrodes 130. As an example, side surfaces of the blocking layer 144 may form the same plane as the side surfaces of the gate electrodes 130.

A structure of the gate dielectric layer 140 is not limited as illustrated in FIG. 3, and for example, together with the blocking layer 144, the charge storage layer 143 may be disposed to surround the gate electrodes 130. In addition, relative thicknesses of layers constituting the gate dielectric layer 140 are not limited to those illustrated in the drawings, and may be variously changed according to embodiments.

The blocking layer 144 may include silicon oxide ($SiO_2$), silicon nitride ($Si_3N_4$), silicon oxynitride (SiON), a high-k material, or a combination thereof. In this case, the high-k material may refer to a dielectric material having a dielectric constant higher than a dielectric constant of silicon oxide ($SiO_2$). The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), or combinations thereof.

The tunneling layer 142 may tunnel electric charges to the charge storage layer 143 using an F-N tunneling method. The tunneling layer 142 may include, for example, silicon oxide ($SiO_2$), silicon nitride ($Si_3N_4$), silicon oxynitride (SiON), or a combination thereof. The charge storage layer 143 may be a charge trap layer and may be made of silicon nitride.

In a semiconductor device 100 according to some embodiments of the present inventive concept, the channel layer 145 may be disposed on a side surface of the channel insulating layer 150 and at least a portion of a side surface of the pad layer 155. The channel layer 145 may include a plurality of regions. For example, the channel layer 145 may include a first channel region 145a, and a second channel region 145b having a length shorter than a length of the first channel region 145a. For example, the first channel region 145a may be disposed on a side surface of the channel insulating layer 150, and the first channel region 145a may be disposed on the second channel region 145b.

A lower surface of the second channel region 145b may be located on a height level, equal to a height level of an upper surface of the channel insulating layer 150. This is only illustrative, and is not limited, and the lower surface of the second channel region 145b may be on a height level, higher or lower than the height level of the upper surface of the channel insulating layer 150.

A thickness of the first channel region 145a may be equal to a thickness of the second channel region 145b. According to embodiments, the thickness of the first channel region 145a and the thickness of the second channel region 145b may be different from each other. For example, when a channel doped with an impurity is formed, the thickness of the second channel region 145b may be greater than the thickness of the first channel region 145a. The thickness of the second channel region 145b may be less than the thickness of the first channel region 145a, when an etchback process may be performed. In some embodiments, the thickness of the second channel region 145b may be greater than the thickness of the first channel region 145a. In some embodiments, the thickness of the first channel region 145a and/or the thickness of the second channel region 145b may be in ranges of 1 nm to 5 nm, respectively.

In some embodiments, each of the first channel region 145a and the second channel region 145b included in the channel layer 145 may have different impurity concentrations. For example, the second channel region 145b may include a semiconductor material doped with a first conductivity type impurity, and the first channel region 145a may include a semiconductor material having an impurity concentration lower than an impurity concentration of the second channel region 145b. In some embodiments, the semiconductor material included in the first channel region 145a may include an impurity diffused from the second channel region 145b. Preferably, the first channel region 145a, may include an undoped semiconductor material.

The pad layer 155 may include a semiconductor material doped with a second conductivity type impurity, different from the first conductivity type impurity included in the second channel region 145b. For example, the first conductivity type impurity may be a p-type impurity, and the second conductivity type impurity may be an n-type impurity. The first conductivity type impurity may be a group III element of the periodic table of elements, such as boron (B) or the like. The second conductivity type impurity may be a group V element of the periodic table of elements, for example phosphorus (P), arsenic (As), or the like.

The lower surface of the second channel region 145b may be located on a height level lower than a height level of a lower surface of a first erase gate electrode 131 located in an uppermost portion of the gate electrodes 130. Therefore, in a semiconductor device 100 according to some embodiments of the present inventive concept, the first erase gate electrode 131, the second channel region 145b, and the pad layer 155 may overlap.

In a semiconductor device 100 according to some embodiments of the present inventive concept, a P-N junction may occur in a contact region J contacting the second channel region 145b including a semiconductor material doped with a first conductivity type impurity and the pad layer 155 including a semiconductor material doped with a second conductivity type impurity. Therefore, an electron-hole pair may be formed in a depletion region near the contact region J, and a reverse bias may be formed due to space charges. In this case, expansion of the depletion region near the first channel region 145a, not doped by the second channel region 145b including a p-type semiconductor material, may be minimized.

In order to maintain the P-N junction, doping of the semiconductor material included in the second channel region 145b may not be canceled out due to diffusion of the second conductivity type impurity included in the pad layer 155. Therefore, an impurity concentration of the second channel region 145b may be equal to or higher than an impurity concentration of the pad layer 155.

For example, an impurity concentration of a semiconductor material doped with the second conductivity type impurity may be 1 $e^{20}$/cm$^3$ to 1.5 $e^{20}$/cm$^3$, and an impurity concentration of a semiconductor material doped with the first conductivity type impurity may be 2 $e^{20}$/cm$^3$ to 3 $e^{20}$/cm$^3$. This is only illustrative, and is not limited, and impurity concentrations of semiconductor materials doped with the first and second conductivity type impurities may have a predetermined value, respectively, different from the above, as necessary.

An area in which a GIDL current is generated when an erase operation of a semiconductor device 100 according to some embodiments of the present inventive concept is performed, may increase, as compared to an area in which a GIDL current is generated when no P-N junction is formed between the second channel region 145b and the pad layer 155. For example, the number of electrons moving to the pad layer 155 and the number of holes moving to the second channel region 145b may increase, as compared to a case in which the P-N junction is not formed. Therefore, due to the holes injected into the second channel region 145b, an erase operation may be better performed, and efficiency of a current may be improved.

Figure 4:
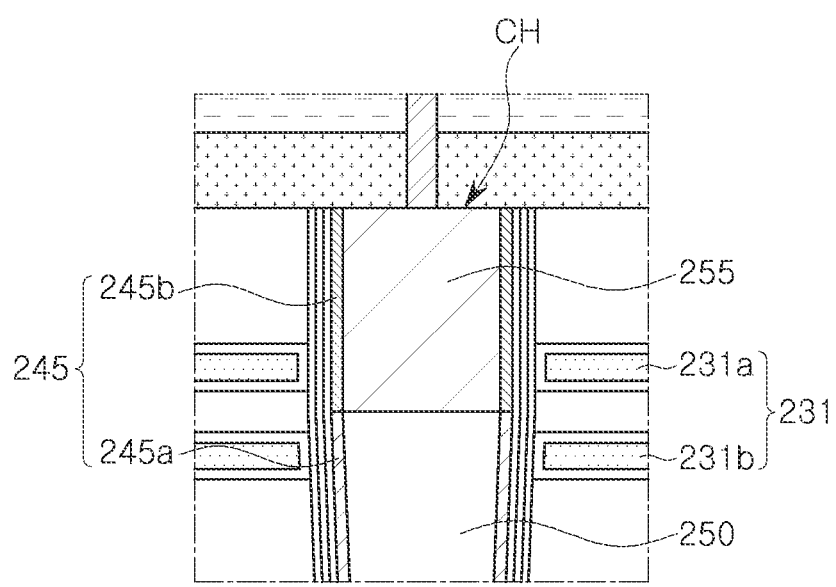
FIG. 4 is a partially enlarged view of a case in which there are two erase gate electrodes in a semiconductor device according to some embodiments of the present inventive concept.
Figure 4:
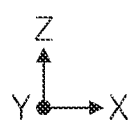

FIG. 4 is a partially enlarged view of a case in which there are two erase gate electrodes in a semiconductor device according to some embodiments of the present inventive concept.

Referring to FIG. 4, in a semiconductor device 200 according to some embodiments of the present inventive concept, an erase gate electrode 231 used to intentionally generate a GIDL current may include a first erase gate electrode 231a and a second erase gate electrode 231b. For example, a second erase gate electrode 231b may be disposed below a first erase gate electrode 231a.

The first erase gate electrode 231a and the second erase gate electrode 231b may respectively have a thickness, thinner than a thickness of the first erase gate electrode 131 illustrated in FIG. 3. This is only illustrative, and a first erase gate electrode 231a and a second erase gate electrode 231b according to some embodiments of the present inventive concept respectively have a thickness, equal to or greater than a thickness of the first erase gate electrode 131 illustrated in FIG. 3.

The GIDL current may be generated by a region in which the erase gate electrode 231 and a pad layer 255 overlap in a horizontal direction. The pad layer 255 may completely overlap the first erase gate electrode 231a, and may further overlap at least a portion of the second erase gate electrode 231b, according to some embodiments.

For example, a lower surface of the pad layer 255 may be located, at least, on a height level on which a lower surface of the second erase gate electrode 231b is located, and may be located on a height level, equal to or lower than a height level on which a lower surface of the first erase gate electrode 231a is located. This is only illustrative, and is not limited, and the lower surface of the pad layer 255 may be located on a predetermined height level for an erase operation of a semiconductor device 200 according to some embodiments of the present inventive concept, by using a GIDL current.

Even when the erase gate electrode 231 is provided as two erase gate electrodes, a channel layer 245 may be divided into a first channel region 245a and a second channel region 245b, in a similar manner to the semiconductor device 100 illustrated in FIG. 3. In addition, the second channel region 245b and the pad layer 255 may include a doped semiconductor material, in a manner similar to the second channel region 145b and the pad layer 155 in the semiconductor device 100 illustrated in FIG. 3, and a P-N junction between the second channel region 245b and the pad layer 255 may be used to improve efficiency of a GIDL current.

FIGS. 5 to 9 are partially enlarged views of semiconductor devices according to embodiments of the present inventive concept.

Figure 5:
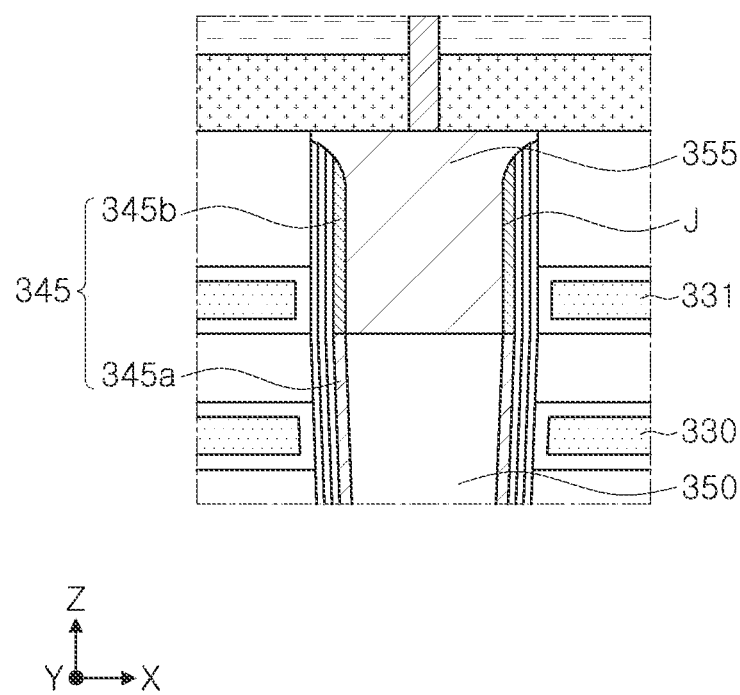
FIGS. 5 to 9 are partially enlarged views of semiconductor devices according to embodiments of the present inventive concept.

Referring to FIG. 5, in a semiconductor device 300 according to some embodiments of the present inventive concept, a channel layer 345 may have a shape, different from a shape of the channel layer 145 of the semiconductor device 100 illustrated in FIG. 3, according to a manufacturing method. As an example, when compared to the channel layer 145 of the semiconductor device 100 illustrated in FIG. 3, at least a portion of the channel layer 345 and at least a portion of a gate dielectric layer may be etched together by an etch-back process.

As an example, the channel layer 345 may be disposed on a side surface of a channel insulating layer 350 and at least a portion of a side surface of a pad layer 355. The channel layer 345 may include a plurality of regions. As an example, the channel layer 345 may include a first channel region 345a disposed on the side surface of the channel insulating layer 350, and a second channel region 345b disposed on the first channel region 345a.

At least a portion of the pad layer 355 may be disposed on the second channel region 345b. For example, one side surface and an upper surface of the second channel region 345b may be in contact with the pad layer 355. In addition, at least a portion of the pad layer 355 may be disposed on an upper surface of the gate dielectric layer by an etch-back process. This is only illustrative, and is not limited, and the pad layer 355 may not be disposed on an upper surface of an ONO layer, according to embodiments.

Arrangements and characteristics of other components may be similar to those of the semiconductor device 100 illustrated in FIG. 3. For example, a gate electrode 331 located in an uppermost portion of gate electrodes 330 may be a first erase gate electrode 331. The first erase gate electrode 331 may overlap at least a portion of the pad layer 355 in a horizontal direction. In a direction, perpendicular to an upper surface of a substrate, a length of the second channel region 345b may be greater than a thickness of the first erase gate electrode 331. For example, the second channel region 345b may extend, at least, to have a height level, equal to a height level of an upper surface of the first erase gate electrode 331, in a direction, perpendicular to the upper surface of the substrate.

In some embodiments, each of the first channel region 345a and the second channel region 345b included in the channel layer 345 may have different impurity concentrations. For example, the second channel region 345b may include a semiconductor material doped with a first conductivity type impurity, and the first channel region 345a may include a semiconductor material having an impurity concentration lower than an impurity concentration of the second channel region 345b. In some embodiments, the semiconductor material included in the first channel region 345a may include an impurity diffused from the second channel region 345b. Preferably, the first channel region 345a may include an undoped semiconductor material.

The pad layer 355 may include a semiconductor material doped with a second conductivity type impurity, different from the first conductivity type impurity included in the second channel region 345b. For example, the first conductivity type impurity may be a p-type impurity, and the second conductivity type impurity may be an n-type impurity. An impurity concentration of the semiconductor material doped with the first conductivity type impurity, included in the second channel region 345b, may be equal to or higher than an impurity concentration of the semiconductor material doped with the second conductivity type impurity, included in the pad layer 355.

In a semiconductor device 300 according to some embodiments of the present inventive concept, a P-N junction may occur in a contact region J contacting the second channel region 345b including a semiconductor material doped with a first conductivity type impurity and the pad layer 355 including a semiconductor material doped with a second conductivity type impurity. In addition, an area of the contact region may be greater than an area of the contact region J in the semiconductor device 100 illustrated in FIG. 3. This is only illustrative, and an area of the contact region J between the first channel region 145a and the pad layer 155 in the semiconductor device 100 illustrated in FIG. 3 may be also equal to or greater than an area of the contact region in the semiconductor device 300.

As mentioned above, a hole may be injected into the second channel region 345b by the P-N junction generated in the contact region between the second channel region 345b and the pad layer 355, to improve performing of an erase operation of a semiconductor device 300 according to some embodiments of the present inventive concept. Therefore, efficiency of a GIDL current may be improved.

Figure 6:
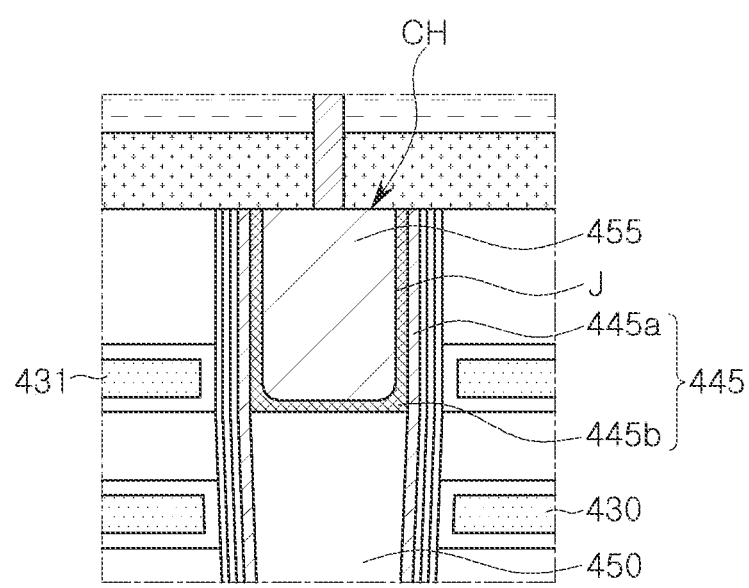

Referring to FIG. 6, in a semiconductor device 400 according to some embodiments of the present inventive concept, a shape of a channel layer 445 may be different from shapes of the channel layers 145 and 345 of the semiconductor devices 100 and 300 illustrated in FIGS. 3 and 5, according to a manufacturing method thereof. For example, a channel structure CH of a semiconductor device 400 according to some embodiments of the present inventive concept may further include a second channel region 445b, which is separately doped.

As an example, the channel structure CH may include a channel insulating layer 450, a pad layer 455 located on the channel insulating layer 450, and a channel layer 445. The channel layer 445 may include a first channel region 445a and a second channel region 445b, in a similar manner to the semiconductor device 100 illustrated in FIG. 3. The first channel region 445a may correspond to the channel layer 145 illustrated in FIG. 3, and the second channel region 445b may be a separate channel region added in a later process.

At least a portion of the second channel region 445b may be disposed between the first channel region 445a and the pad layer 455 in a direction, parallel to an upper surface of a substrate. A thickness of the second channel region 445b may be, at least, less than a radius of a channel hole. The radius of the channel hole may be generally about 30 nm to 50 nm, but this is only illustrative, and is not limited, and the thickness of the second channel region 445b may be equal to or less than a thickness of the first channel region 445a.

In some embodiments, each of the first channel region 445a and the second channel region 445b included in the channel layer 445 may have different impurity concentrations. For example, the second channel region 445b may include a semiconductor material doped with first conductivity type impurity, and the first channel region 445a may include a semiconductor material having an impurity concentration lower than an impurity concentration of the second channel region 445b. In some embodiments, the semiconductor material included in the first channel region 445a may include an impurity diffused from the second channel region 445b.

The second channel region 445b may include a first conductivity type impurity doped by plasma doping (PLAD), instead of an ion implant, or may be formed by stacking layers doped with the first conductivity type impurity in advance.

The pad layer 455 may include a semiconductor material doped with a second conductivity type impurity, different from the first conductivity type impurity included in the second channel region 445b. For example, the first conductivity type impurity may be a p-type impurity, and the second conductivity type impurity may be an n-type impurity. An impurity concentration of the second channel region 445b may be equal to or higher than an impurity concentration of the pad layer 455.

Arrangements and characteristics of other components may be similar to those of the semiconductor device 100 illustrated in FIG. 3. For example, a gate electrode 431 located in an uppermost portion of gate electrodes 430 may be a first erase gate electrode 431. The first erase gate electrode 431 may overlap at least a portion of the pad layer 455 in a horizontal direction.

In a semiconductor device 400 according to some embodiments of the present inventive concept, a P-N junction may occur in a contact region J contacting a second channel region 445b including a semiconductor material doped with a first conductivity type impurity and the pad layer 455 including a semiconductor material doped with a second conductivity type impurity.

As mentioned above, a hole may be injected into the second channel region 445b by the P-N junction generated in the contact region J between the second channel region 445b and the pad layer 455, to perform better an erase operation of the semiconductor device 400 according to some embodiments of the present inventive concept. Therefore, efficiency of a GIDL current may be improved.

Figure 7:
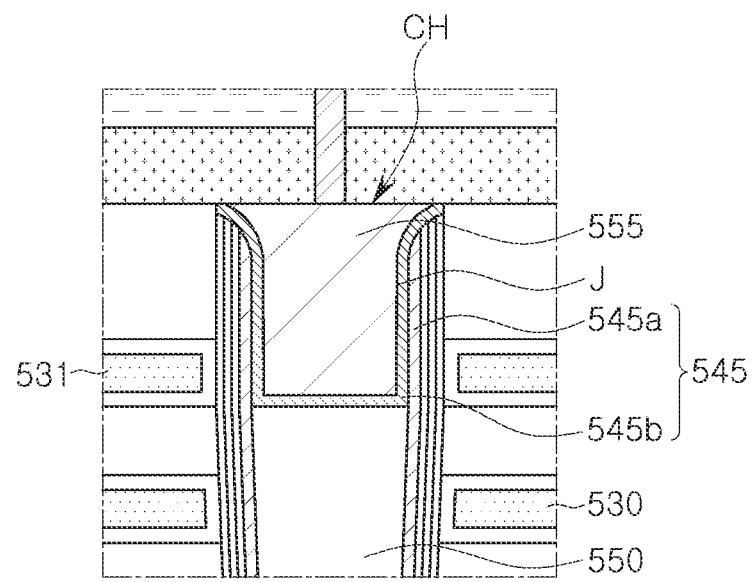

Referring to FIG. 7, in a semiconductor device 500 according to some embodiments of the present inventive concept, a first channel region 545a and a second channel region 545b may correspond to the first channel region 445a and the second channel region 445b of the semiconductor device 400 illustrated in FIG. 6, but may have different shapes, according to a manufacturing method thereof. As an example, when the first channel region 545a and the second channel region 545b are compared to those of the semiconductor device 400 illustrated in FIG. 6, a channel layer 545 and at least a portion of a gate dielectric layer may be etched together by an etch-back process.

Therefore, at least a portion of the second channel region 545b may be disposed on the first channel region 545a and the gate dielectric layer. In addition, the second channel region 545b may be disposed such that upper and side surfaces thereof cover or overlap a pad layer 555. This is only illustrative, and is not limited, and arrangements of the first channel region 545a, the second channel region 545b, the gate dielectric layer, and the pad layer 555 may be modified, according to a process.

Arrangement and characteristics of other components may be similar to the semiconductor device 400 illustrated in FIG. 6. For example, a gate electrode 531 located in an uppermost portion of gate electrodes 530 may be a first erase gate electrode 531. The first erase gate electrode 531 may overlap at least a portion of the pad layer 555 in a horizontal direction. In a direction, perpendicular to an upper surface of a substrate, a length of the first channel region 545a and a length of the second channel region 545b may be respectively greater than a thickness of the first erase gate electrode 531.

In some embodiments, each of the first channel region 545a and the second channel region 545b included in the channel layer 545 may have different impurity concentrations. For example, the second channel region 545b may include a semiconductor material doped with a first conductivity type impurity, and the first channel region 545a may include a semiconductor material having an impurity concentration lower than an impurity concentration of the second channel region 545b or may include a semiconductor material, not doped. For example, the semiconductor material included in the first channel region 545a may include an impurity diffused from the second channel region 545b.

The pad layer 555 may include a semiconductor material doped with a second conductivity type impurity, different from the first conductivity type impurity. For example, the first conductivity type may be p-type, and the second conductivity type may be n-type. An impurity concentration of the second channel region 545b may be equal to or higher than an impurity concentration of the pad layer 555.

In a semiconductor device 500 according to some embodiments of the present inventive concept, a P-N junction may occur in a contact region J contacting a second channel region 545b including a semiconductor material doped with a first conductivity type impurity and the pad layer 555 including a semiconductor material doped with a second conductivity type impurity. In addition, an area of the contact region J may be greater than an area of the contact region J in the semiconductor device 400 illustrated in FIG. 6. This is only illustrative, and an area of the contact region J between the second channel region 445b and the pad layer 455 in the semiconductor device 400 illustrated in FIG. 6 may be also equal to or greater than an area of the contact region J in the semiconductor device 500.

As mentioned above, a hole may be injected into the first channel region 545a by the P-N junction generated in the contact region J between the second channel region 545b and the pad layer 555, to perform better an erase operation of a semiconductor device 500 according to some embodiments of the present inventive concept. Therefore, efficiency of a GIDL current may be improved.

Figure 8:
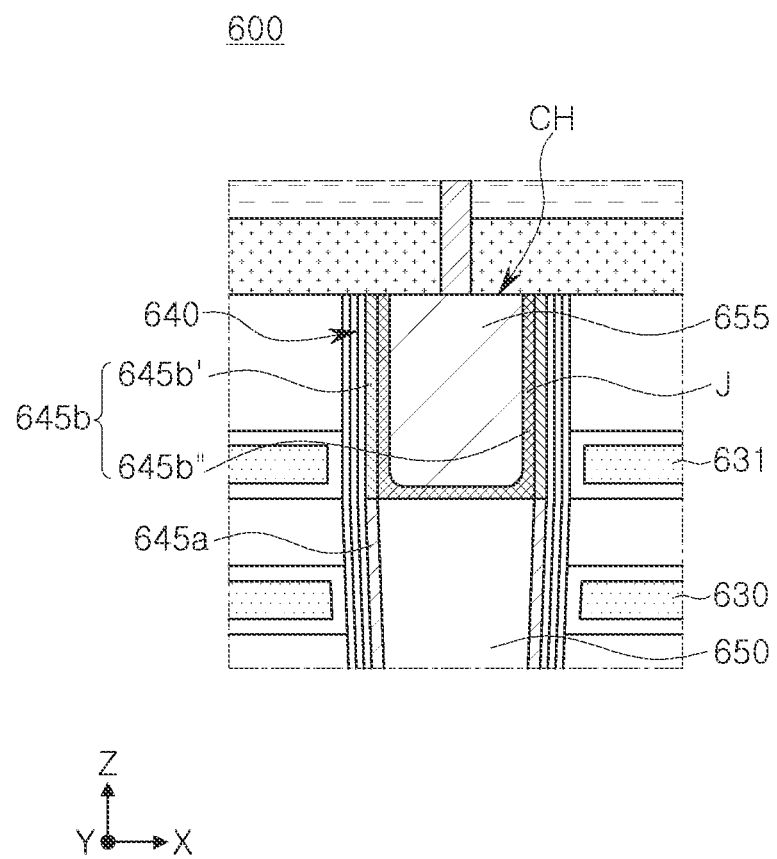

Referring to FIG. 8, in a semiconductor device 600 according to some embodiments of the present inventive concept, a shape of a channel structure CH may be different from shapes of the channel structures CH of the semiconductor devices 100 and 400 illustrated in FIGS. 3 and 6, according to a manufacturing method thereof.

As an example, a channel structure CH of a semiconductor device 600 according to some embodiments of the present inventive concept may include first channel layers 645a and 645b', formed prior to a channel insulating layer 650, and a second separate channel layer 645b'' formed after the channel insulating layer 650.

For example, the channel structure CH may include a channel insulating layer 650, a pad layer 655 located on the channel insulating layer 650, first channel layers 645a and 645b' arranged on a side surface of a gate dielectric layer 640, and a second channel layer 645b" disposed on the channel insulating layer 650 and on at least a portion of side surfaces of the first channel layers 645a and 645b'. As an example, the first channel layers 645a and 645b' may correspond to the channel layer 145 illustrated in FIG. 3. The second channel layer 645b" may also extend to and be disposed between the channel insulating layer 650 and the pad layer 655, forming a U-shape.

In a semiconductor device 600 according to some embodiments of the present inventive concept, the first channel layers 645a and 645b' may be divided into a plurality of regions, according to a doping state of a semiconductor material included therein. As an example, the first channel layers 645a and 645b' may include a first region 645a disposed on a side surface of the channel insulating layer 650, and a second region 645b' disposed on an upper surface of the first region 645a.

In some embodiments, each of the first region 645a and the second region 645b' included in the first channel layers 645a and 645b' may have different impurity concentrations. For example, the second region 645b' may include a semiconductor material doped with a first conductivity type impurity, and the first region 645a may include a semiconductor material having an impurity concentration lower than an impurity concentration of the second region 645b'. In some embodiments, the semiconductor material included in the first region 645a may include an impurity diffused from other regions. Preferably, the first region 645a may include an undoped semiconductor material.

The second channel layer 645b" may include a semiconductor material doped with the same first conductivity type impurity as the second region 645b'. An impurity concentration of the second channel layer 645b" may be different from an impurity concentration of the second region 645b'. For example, an impurity concentration of the second channel layer 645b" may be higher than an impurity concentration of the second region 645b'. This is only illustrative, and is not limited. For example, the first conductivity type impurity may be a p-type impurity.

The first region 645a may be defined as a first channel region 645a. Since both the second region 645b' and the second channel layer 645b" may include a semiconductor material doped with a p-type impurity, they may be collectively defined as a second channel region 645b. In addition, the second region 645b' included in the second channel region 645b may be defined as a first p-type semiconductor region 645b', and the second channel layer 645b" may be defined as a second p-type semiconductor region 645b".

Impurity concentrations of semiconductor materials included in the first p-type semiconductor region 645b' and the second p-type semiconductor region 645b" may be different from each other. These are only illustrative, and are not limited, and the impurity concentrations may be the same as necessary. Also, each of the regions may further include a plurality of regions having different impurity concentrations.

The first p-type semiconductor region 645b' may be selectively doped by an ion implant, and the second p-type semiconductor region 645b" may be doped by plasma doping (PLAD) or may be formed by stacking layers, doped in advance. This is only illustrative, and is not limited, and each of the regions included in the second channel region 645b may be doped in the same or different manner.

The pad layer 655 disposed to be covered by or overlapped on a side portion by the second channel region 645b may include a semiconductor material doped with a second conductivity type impurity, different from a first conductivity type impurity. For example, the second conductivity type may be n-type. An impurity concentration of the second channel region 645b may be equal to or higher than an impurity concentration of the pad layer 655.

Arrangement and characteristics of other components may be similar to the semiconductor device 400 illustrated in FIG. 6. For example, a gate electrode 631 located in an uppermost portion of gate electrodes 630 may be a first erase gate electrode 631. The first erase gate electrode 631 may overlap at least a portion of the pad layer 655 in a horizontal direction.

In a semiconductor device 600 according to some embodiments of the present inventive concept, a P-N junction may occur in a contact region J contacting the second channel region 645b including a semiconductor material doped with a first conductivity type impurity and the pad layer 655 including a semiconductor material doped with a second conductivity type impurity.

As mentioned above, a hole may be injected into the first channel region 545a by the P-N junction generated in the contact region J between the second channel region 645b and the pad layer 655, to perform better an erase operation of a semiconductor device 600 according to some embodiments of the present inventive concept. Therefore, efficiency of a GIDL current may be improved.

Figure 9:
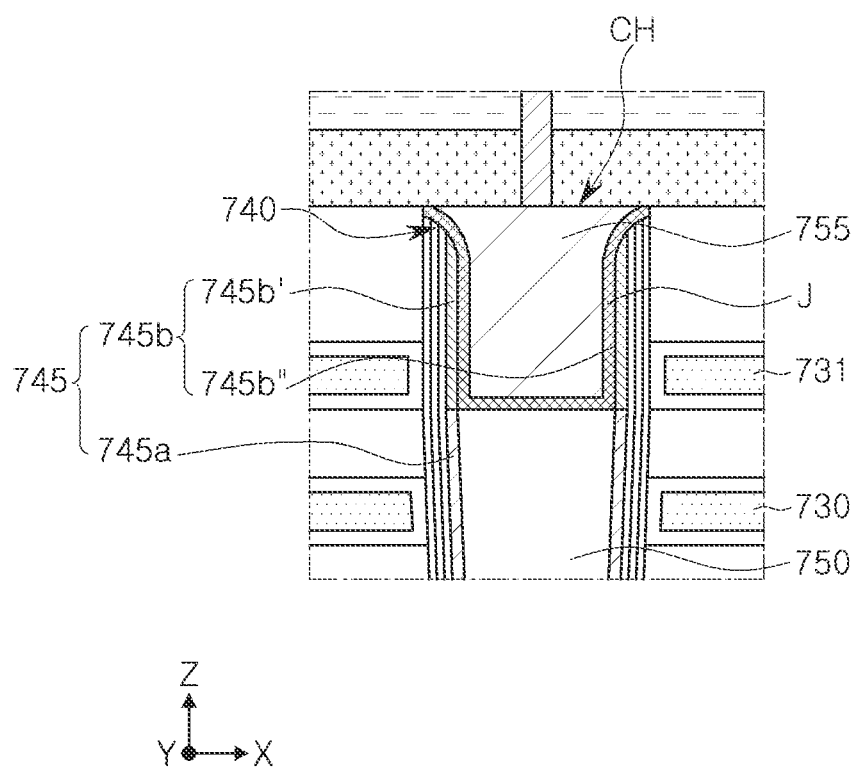

Referring to FIG. 9, in a semiconductor device 700 according to some embodiments of the present inventive concept, a shape of a channel structure CH may be different from a shape of the channel structure CH of the semiconductor device 600 illustrated in FIG. 8, according to a manufacturing method thereof. For example, when compared to the channel structure CH of the semiconductor device 600 illustrated in FIG. 8, a channel layer 745 and at least a portion of a gate dielectric layer may be etched together by an etch-back process.

A channel structure CH of a semiconductor device 700 according to some embodiments of the present inventive concept, in a similar manner to the semiconductor device 600 illustrated in FIG. 8, may include first channel layers 745a and 745b', formed prior to a channel insulating layer 750, and a second separate channel layer 745b" formed after and separately from the channel insulating layer 750.

For example, the channel structure CH may include a channel insulating layer 750, a pad layer 755 located on the channel insulating layer 750, first channel layers 745a and 745b' arranged on at least a portion of a side surface of a gate dielectric layer 740, and a second channel layer 745b" disposed on the channel insulating layer 750 and on at least a portion of side surfaces of the first channel layers 745a and 745b'. As an example, the first channel layers 745a and 745b' may correspond to the channel layer 145 illustrated in FIG. 3.

At least a portion of the second channel layer 745b" may be disposed on the first channel layers 745a and 745b' and the gate dielectric layer 740 by an etch-back process. In addition, the second channel layer 745b" may be disposed such that upper and side surfaces thereof cover the pad layer 755. This is only illustrative, and is not limited, and arrangements of the channel layers 745a and 745b, the gate dielectric layer 740, and the pad layer 755 may be modified, according to a process.

Arrangements and characteristics of other components may be similar to the semiconductor device 600 illustrated in FIG. 8. For example, a gate electrode 731 located in an uppermost portion of gate electrodes 730 may be a first erase gate electrode 731. The first erase gate electrode 731 may overlap at least a portion of the pad layer 755 in a horizontal direction.

In addition, in a semiconductor device 700 according to some embodiments of the present inventive concept, the first channel layers 745a and 745b' may be divided into a plurality of regions, according to a doping state of a semiconductor material included therein. As an example, the first channel layers 745a and 745b' may be a first region 745a disposed on a side surface of the channel insulating layer 750 and a second region 745b' disposed on an upper surface of the first region 745a.

For example, the second region 745b' may include a semiconductor material doped with a first conductivity type impurity, and the first region 745a may include a semiconductor material having an impurity concentration lower than an impurity concentration of the second region 745b'. The second channel layer 745b" may include a semiconductor material doped with the same first conductivity type impurity as the second, region 745b'. The pad layer 755 may include a semiconductor material doped with a second conductivity type impurity, different from a first conductivity type impurity. For example, the first conductivity type may be p-type, and the second conductivity type may be n-type.

The first region 745a may be defined as a first channel region 745a. The second region 745b' and the second channel layer 745b" may include a semiconductor material doped with p-type impurities, and may be thus defined as a second channel region 745b. An impurity concentration of the second channel region 745b may be equal to or higher than an impurity concentration of the pad layer 755.

In a semiconductor device 700 according to some embodiments of the present inventive concept, a P-N junction may occur in a contact region J contacting the second channel region 745b including a semiconductor material doped with a first conductivity type impurity and the pad layer 755 including a semiconductor material doped with a second conductivity type impurity. In addition, an area of the contact region J may be greater than an area of the contact region J in the semiconductor device 600 illustrated in FIG. 8. This is only illustrative, and an area of the contact region J in the semiconductor device 600 illustrated in FIG. 8 may be also equal to or greater than an area of the contact region J in the semiconductor device 700.

As mentioned above, a hole may be injected into the first channel region 745a by the P-N junction generated in the contact region J, to perform better an erase operation of a semiconductor device 700 according to some embodiments of the present inventive concept. Therefore, efficiency of a GIDL current may be improved.

FIGS. 10A to 10E are schematic cross-sectional views illustrating a method of manufacturing a semiconductor device according to some embodiments of the present inventive concept.

Figure 10A:
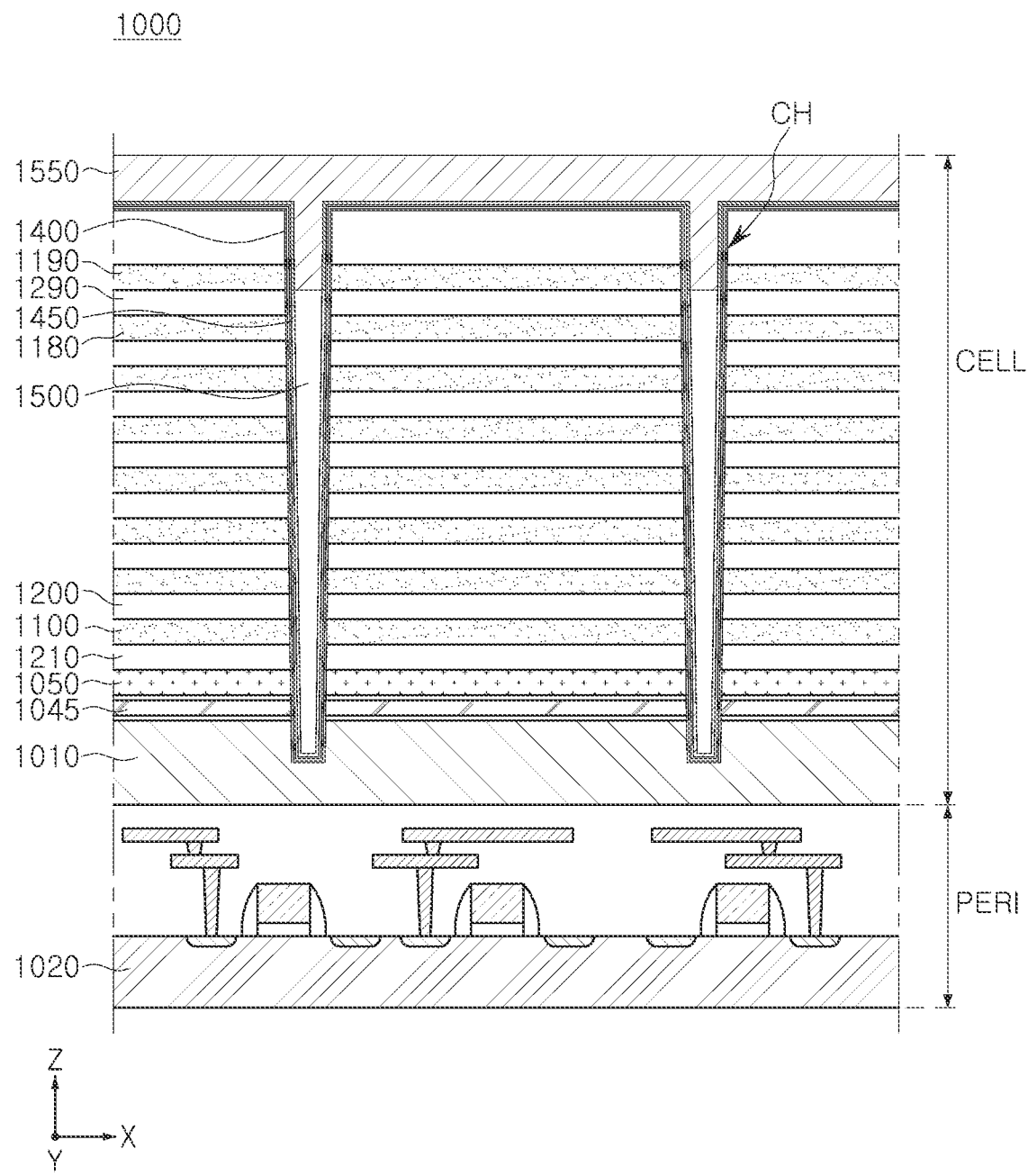
FIGS. 10A to 10E are schematic cross-sectional views illustrating a method of manufacturing a semiconductor device according to some embodiments of the present inventive concept.

Referring to FIG. 10A, in order to manufacture a semiconductor device 1000 according to embodiments of the present inventive concept, a peripheral circuit region PERI may be first formed. Circuit elements, circuit contact plugs, and circuit wiring lines may be arranged on a base substrate 1020 of the peripheral circuit region PERI. A substrate 1010 for forming a cell region CELL may be disposed on the peripheral circuit region PERI.

A sacrificial source layer 1045 and a second conductive layer 1050 may be formed on the substrate 1010. The sacrificial source layer 1045 may be a layer to be replaced with a first conductive layer by a subsequent process.

Interlayer sacrificial layers 1100 and insulating layers 1200 may be alternately stacked on the second conductive layer 1050 to form a stack structure. The interlayer sacrificial layers 1100 may be layers to be replaced with gate electrodes by a subsequent process.

The interlayer sacrificial layers 1100 may be formed of a material, different from the insulating layers 1200. For example, the insulating layer 1200 may be formed of at least one of silicon oxide or silicon nitride, and the interlayer sacrificial layers 1100 may be formed of at least one of silicon, silicon oxide, silicon carbide, or silicon nitride. Thicknesses of the insulating layers 1200 may not be the same as each other.

For example, a lowermost insulating layer 1210 may be formed to be relatively thin, and an uppermost insulating layer 1290 may be formed to be relatively thick. This is only illustrative, and is not limited, and thicknesses of the insulating layers 1200 and the interlayer sacrificial layers 1100 and the number of constituting layers may be variously changed from those illustrated.

An insulating layer may be disposed in an uppermost portion of the stack structure, and channel holes may be formed to prepare channel structures CH passing through the stack structure. The channel holes may be formed by anisotropically etching the stack structure, and may be formed to have a hole shape. Due to a height of the stack structure, sidewalk of the channel holes may not be formed perpendicularly to an upper surface of the substrate 1010. The channel structures CH may be narrower in width in a X-axis direction in a lower region that is closer to the substrate 1010 than a higher region that is further from the substrate 1010. The channel holes may be formed to pass through a portion of the substrate 1010.

Next, a gate dielectric layer 1400, a channel layer 1450, a channel insulating layer 1500, and a pad layer 1550 may be formed in the channel holes to prepare the channel structures CH.

The gate dielectric layer 1400 may be formed to have a uniform thickness by using atomic layer deposition (ALD) or chemical vapor deposition (CVD). In this operation, all or portion of the gate dielectric layer 1400 may be formed. For example, a tunneling layer and a charge storage layer extending in a direction, perpendicular to the upper surface of the substrate 1010, may be formed along the channel structures CH.

Next, the channel layer 1450 may be deposited on the gate dielectric layer 1400 in the channel holes. The channel insulating layer 1500 may be formed to fill the channel holes, and may be formed of an insulating material. This is only illustrative, and is not limited, and the channel holes may be filled with a conductive material, other than the channel insulating layer 1500. The pad layer 1550 may be formed of a conductive material, and, for example, may include polycrystalline silicon.

A process of forming the channel structure CH may be modified, according to embodiments. As an example, in the process of forming the channel structure CH, an ion implant and/or plasma doping (PAD) may be used or an operation of stacking pre-doped layers or the like may be included according to the number and doping type of the included channel layers 1450. An etch-back process may be added to the process of forming the channel structure CH. A process of forming the channel structure CH according to different embodiments of the present inventive concept will be described later.

In a semiconductor device 1000 according to some embodiments of the present inventive concept, the channel insulating layer 1500 may be formed to have a predetermined height, in order to intentionally generate a GIDL current. For example, an upper surface of the channel insulating layer 1500 may be located near a lower surface of a sacrificial layer 1190 disposed in an uppermost portion of the interlayer sacrificial layers 1100.

This is only illustrative, and is not limited, and a height level of the upper surface of the channel insulating layer 1500 may be different from a height level of a lower surface of the sacrificial layer 1190 disposed in the uppermost portion. For example, when only one gate electrode is used as an erase gate electrode, the upper surface of the channel insulating layer 1500 may be located on a height level lower than a height level of the lower surface of the sacrificial layer 1190 disposed in the uppermost portion.

When two gate electrodes are used as erase gate electrodes, the upper surface of the channel insulating layer 1500 may be located on a height level lower than a height level of a lower surface of a sacrificial layer 1180 disposed below the uppermost portion. In some embodiments, the channel insulating layer 1500 may be formed such that the upper surface of the channel insulating layer 1500 is located on a height level lower than a height level of the lower surface of the sacrificial layer 1180, to increase an overlapping area of the pad layer 1550, the channel layer 1450, and the sacrificial layers 1180 and 1190, to be replaced by the erase gate electrodes in a subsequent process. This is only illustrative, and the upper surface of the channel insulating layer 1500 may be located between the lower surfaces of the sacrificial layers 1180 and 1190, sequentially arranged from the uppermost portion.

Figure 10B:
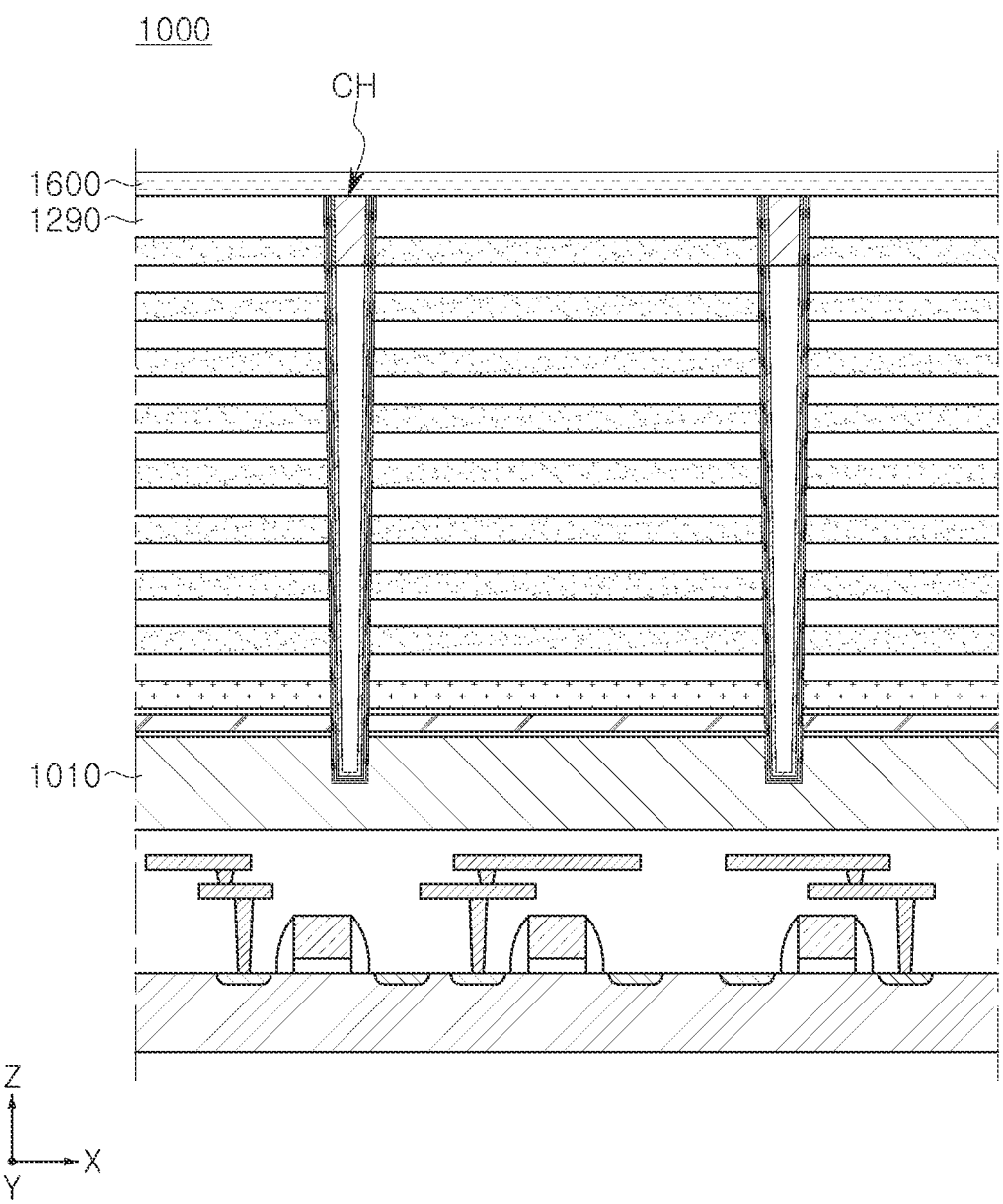

Referring to FIG. 10B, in a semiconductor device 1000 according to some embodiments of the present inventive concept, a chemical mechanical planarization (CMP) process may be performed. A portion of an upper surface of the channel structure CH may be removed using the CMP process. For example, in the channel structure CH of the semiconductor device 1000, undergone the CMP process, only a component disposed perpendicularly to the upper surface of the substrate 1010 may remain. Therefore, the insulating layer 1290 may be exposed from an upper surface of the stack structure on which the channel structure CH is not formed.

After the CMP process, a first interlayer insulating layer 1600 may be additionally formed to cover an upper surface of the semiconductor device 1000. The first interlayer insulating layer 1600 may prevent damage to the pad layer 1550, the channel layer 1450, or the like.

Figure 10C:
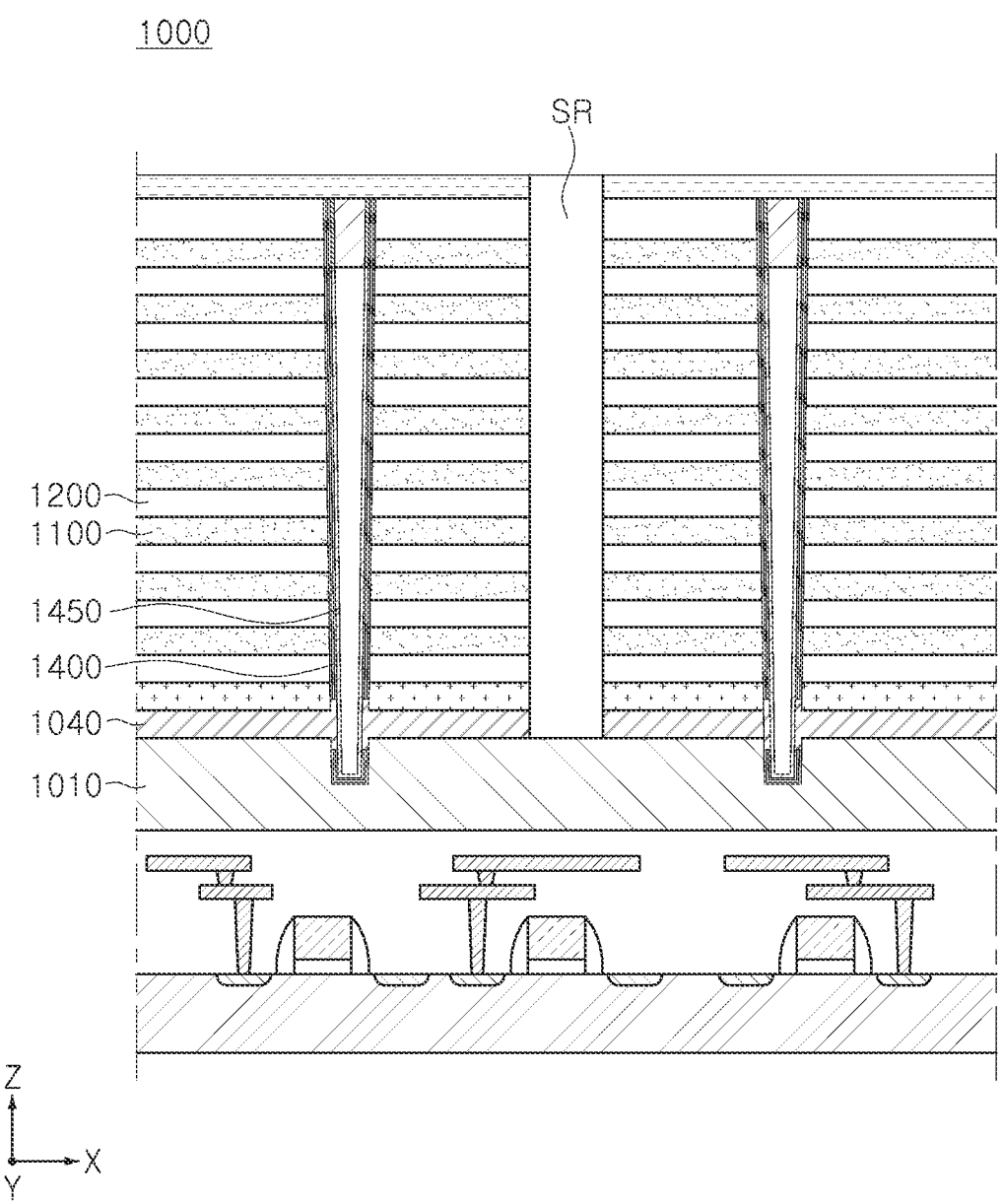

Referring to FIG. 10C, a semiconductor device 1000 according to some embodiments of the present inventive concept may form separation regions SR separating the stack structure at predetermined intervals and passing through the separated stack structure.

The separation region SR may be prepared by forming a mask layer using a photolithography process and anisotropically etching the stack structure of the interlayer sacrificial layers 1100 and the insulating layers 1200. The separation regions SR may be formed to have a trench shape extending in the Y-axis direction.

In a semiconductor device 1000 according to some embodiments of the present inventive concept, the sacrificial source layer 1045, disposed on the upper surface of the substrate 1010 illustrated in FIG. 10B, may be exposed to the separation regions SR. The exposed sacrificial source layer 1045 may be removed, and a first conductive layer 1040 may be formed in the removed space. In the process of removing the sacrificial source layer 1045, a portion of the gate dielectric layer 1400 disposed between the sacrificial source layer 1045 and the channel layer 1450 may be removed together. For example, a thickness of the removed sacrificial source layer 1045 may be less than a thickness of the portion of the removed gate dielectric layer 1400 in the Z-axis direction. The first conductive layer 1040, formed instead of the sacrificial source layer 1045, may be directly electrically connected to the channel layer 1450.

Figure 10D:
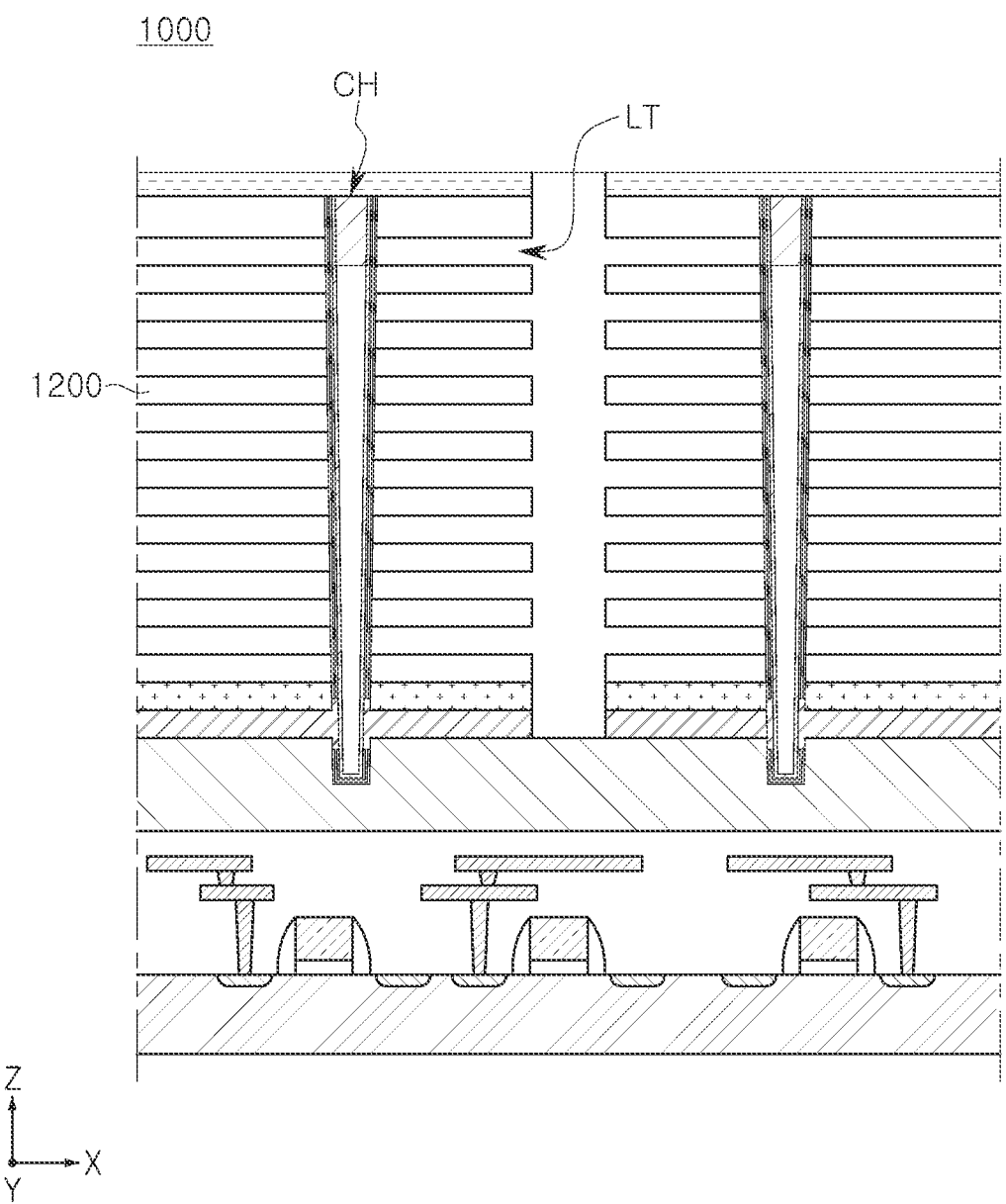

Referring to FIG. 10D together, lateral openings LT may be formed by removing the interlayer sacrificial layers 1100 exposed to the separation regions SR. As an example, the interlayer sacrificial layers 1100 may be selectively removed with respect to the insulating layers 1200 using wet etching. Therefore, the lateral openings LT may be formed as a plurality of lateral openings between the insulating layers 1200, and a portion of the sidewalls of the channel structures CH may be exposed to the lateral openings LT.

Figure 10E:
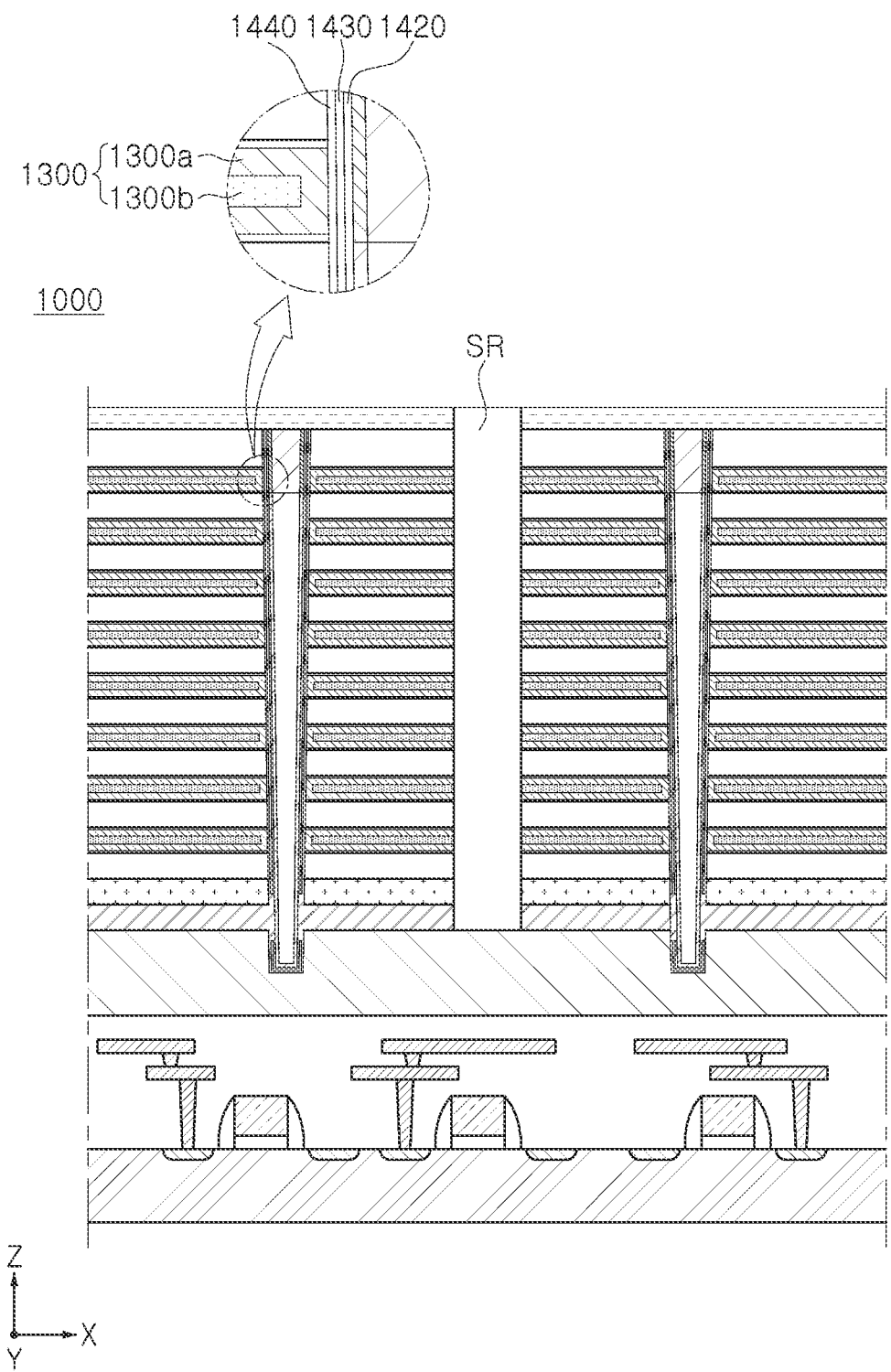

Referring to FIG. 10E, a first gate layer 1300a of gate electrodes 1300 may be formed in the lateral openings LT. For example, before forming the first gate layer 1300a, a blocking layer 1440, which may be a portion of the gate dielectric layer 1400, may be formed in the lateral openings LT. The formation of the blocking layer 1440 is not limited thereto, and the blocking layer 1440 may be previously formed on inner walls of the channel structures CH, together with an electron storage layer 1430, the tunneling layer 1420, or the like.

For example, the first gate layer 1300a may be formed by a CVD or ALD process. The first gate layer 1300a may be formed to have a substantially uniform thickness along the upper and lower surfaces of the insulating layers 1200 and the sidewalk of the channel structures CH, and may be formed to have a thickness not completely filling the lateral openings LT.

The formation of the first gate layer 1300a is not limited to the above process, and an etching process of removing a portion of the gate layer may be performed after a deposition process. For example, during the etching process, the first gate layer 1300a, adjacent to the separation region SR, may be relatively largely exposed to an etchant, to be removed in a relatively large amount, and the first gate layer 1300a, spaced apart from the separation region SR, may be relatively less exposed to the etchant, to be removed in a relatively small amount. Therefore, the first gate layer 1300a may have a shape of which thickness gradually increases as a distance from the separation region SR increases, and may also have an inclined surface profile on upper and lower surfaces of the insulating layers 1200.

In a semiconductor device 1000 according to some embodiments of the present inventive concept, the gate electrodes 1300 may be prepared by forming a second gate layer 1300b on the first gate layer 1300a. For example, the second gate layer 1300b may be formed by a CVD or ALD process. The second gate layer 1300b may be formed to completely fill the lateral openings LT between the insulating layers 1200.

A structure of the gate electrodes 1300 is not limited thereto, and the gate electrodes 1300 may further include a diffusion barrier layer or may include only one gate layer, as needed.

Thereafter, materials forming the gate electrodes 1300 prepared on the sidewalls of the insulating layers 1200 and the substrate 1010 in the separation regions SR may be removed such that the gate electrodes 1300 are only arranged in the lateral openings LT. For example, the removal may be performed by a wet etching process. For an electrical short between the gate electrodes 1300, side surfaces of the gate electrodes 1300 may be formed to be recessed toward the channel structures in a medial direction, as compared to side surfaces of the insulating layers 1200.

After the gate electrodes 1300 is formed, a second interlayer insulating layer, contact plugs, bit lines, and the like may be further formed on the first interlayer insulating layer 1600 to manufacture a semiconductor device 100 as illustrated in FIG. 2.

FIGS. 11A to 11F are partially enlarged views illustrating a method of manufacturing a semiconductor device according to some embodiments of the present inventive concept.

Figure 11A:
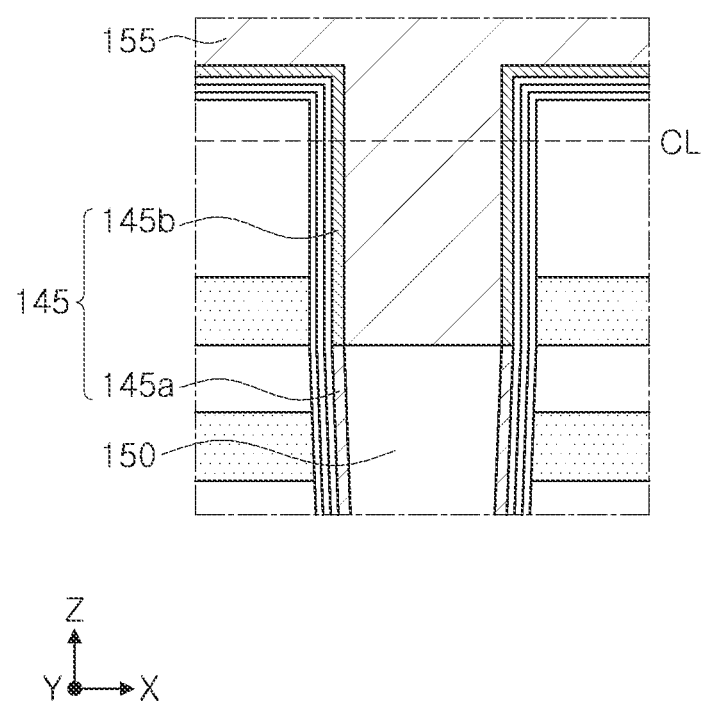
FIGS. 11A to 11F are partially enlarged views illustrating a method of manufacturing a semiconductor device according to some embodiments of the present inventive concept.

A semiconductor device 100 illustrated in FIG. 11A may represent a state during the manufacturing process of the semiconductor device 100 illustrated in FIG. 3. For example, a first channel layer 145 may be formed in a channel structure CH, and a channel insulating layer 150 may be formed to fill a channel hole.

In a semiconductor device 100 according to some embodiments of the present inventive concept, the first channel layer 145 may be selectively doped to include a semiconductor material doped with a first conductivity type impurity, and may be divided into a first channel region 145a and a second channel region 145b, depending on an impurity concentration.

For example, an impurity concentration of the first channel region 145a may be lower than an impurity concentration of the second channel region 145b. Preferably, the first channel region 145a may include an undoped semiconductor material. The first channel region 145a may include a semiconductor material doped with a p-type impurity by an ion implant. The present inventive concept is not limited thereto, and a semiconductor material doped with a p-type impurity by PLAD may be included.

Thereafter, a pad layer 155 may be formed on the channel structure CH. The pad layer 155 may be doped to include a semiconductor material doped with a second conductivity type impurity.

After the channel structure CH is formed, an upper portion of the channel structure CH above a boundary line CL may be removed by applying a CMP process. A first interlayer insulating layer may be formed in the removed upper portion above the boundary line CL, to follow an operation in the manufacturing process illustrated in FIG. 10B.

Figure 11B:
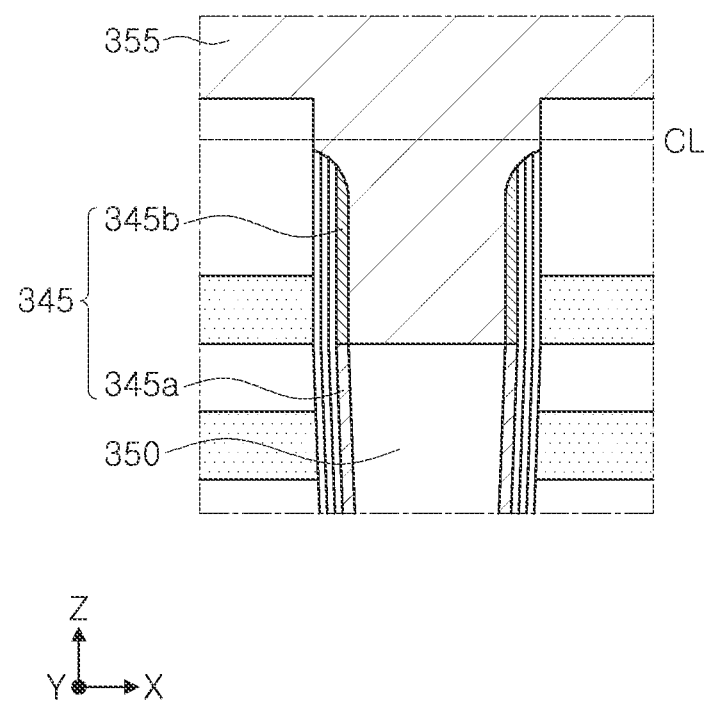

A semiconductor device 300 illustrated in FIG. 11B may represent a state during the manufacturing process of the semiconductor device 300 illustrated in FIG. 5. In a similar manner to the operation in the manufacturing process of the semiconductor device 100 illustrated in FIG. 11A, a first channel layer 345 may be formed in a channel structure CH, and a channel insulating layer 350 may be formed to fill a channel hole.

In a semiconductor device 300 according to some embodiments of the present inventive concept, the first channel layer 345 may be divided into a first channel region 345a and a second channel region 345b, in a similar manner to the semiconductor device 100 illustrated in FIG. 11A. For example, the second channel region 345b may include a p-type semiconductor material.

In a semiconductor device 300 according to some embodiments of the present inventive concept, the channel insulating layer 350 may be etched to a height level, equal to a height level of a lower surface of an erase gate electrode 331 by an etch-back process. In this case, the second channel region 345b and at least a portion of a gate dielectric layer may be removed together by an etch-back process. For example, the second channel region 345b and the gate dielectric layer may be removed to a height level lower than a height level of a boundary line CL. This is only illustrative, and the channel insulating layer 350, the second channel region 345b, and the gate dielectric layer removed by the etch-back process may be modified, according to embodiments.

Upper surfaces of the second channel region 345b and the gate dielectric layer to which the etch-back process is applied may be inclined surfaces. This is only illustrative, and is not limited, and the upper surface of the second channel region 345b may be parallel to an upper surface of a substrate. In addition, the second channel region 345b and the gate dielectric layer may have different etch selectivity. Therefore, height levels of layers remaining after removed by the etch-back process may be different.

Thereafter, a pad layer 355 may be formed on the channel structure CH. The pad layer 355 may be doped to include a semiconductor material doped with a second conductivity type impurity.

After the channel structure CH is formed, an upper portion of the channel structure CH above the boundary line CL may be removed by applying a CMP process. A first interlayer insulating layer may be formed in the removed upper portion above the boundary line CL, to follow an operation in the manufacturing process illustrated in FIG. 10B.

Figure 11C:
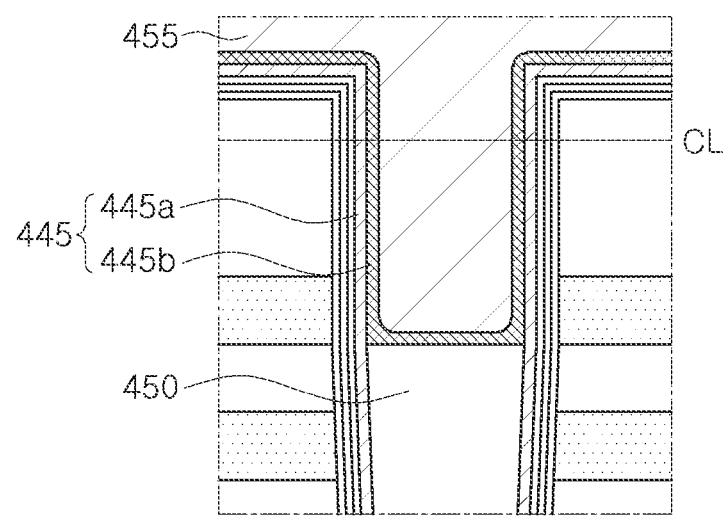

A semiconductor device 400 illustrated in FIG. 11C may represent a state during the manufacturing process of the semiconductor device 400 illustrated in FIG. 6. In a similar manner to the operation in the manufacturing process of the semiconductor device 100 illustrated in FIG. 11A, a first channel region 445a may be formed in a channel structure CH, and a channel insulating layer 450 may be formed to fill a channel hole.

In a semiconductor device 400 according to some embodiments of the present inventive concept, a second channel region 445b may be additionally formed on the side surface of the first channel region 445a on the channel insulating layer 450. The second channel region 445b may be doped to include a semiconductor material doped with a first conductivity type impurity.

The second channel region 445b may include a semiconductor material doped with a p-type impurity by PLAD. The present inventive concept is not limited thereto, and may include a semiconductor material doped with a p-type impurity by an ion implant. The first channel region 445a may preferably include an undoped semiconductor material.

Thereafter, a pad layer 455 may be formed on the channel structure CH. The pad layer 455 may be doped to include a semiconductor material doped with a second conductivity type impurity.

After the channel structure CH is formed, an upper portion of the channel structure CH above a boundary line CL may be removed by applying a CMP process. A first interlayer insulating layer may be formed in the removed upper portion above the boundary line CL, to follow an operation in the manufacturing process illustrated in FIG. 10B.

Figure 11D:
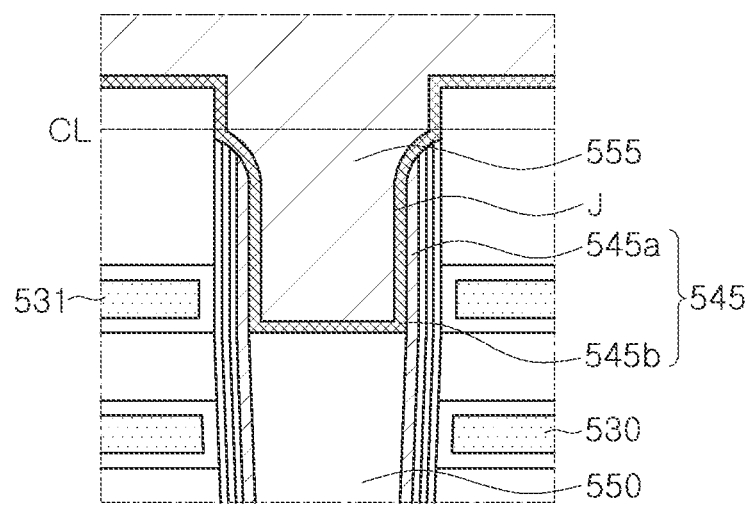
Figure 11D:
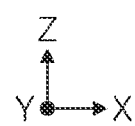

A semiconductor device 500 illustrated in FIG. 11D may represent a state during the manufacturing process of the semiconductor device 500 illustrated in FIG. 7. In a similar manner to the operation in the manufacturing process of the semiconductor device 400 illustrated in FIG. 11C, a first channel region 545a may be formed in a channel structure CH, and a channel insulating layer 550 may be formed to fill a channel hole.

In addition, an etch-back process may be performed, in a similar manner to the semiconductor device 300 illustrated in FIG. 11B. The first channel region 545a and a portion of a gate dielectric layer may be removed together by an etch-back process.

In a semiconductor device 500 according to some embodiments of the present inventive concept, a second channel region 545b may be additionally formed on the channel insulating layer 550, on upper and side surfaces of the first channel region 545a, and on at least a portion of an upper surface of the gate dielectric layer. For example, the second channel region 545b may include a p-type semiconductor material.

Thereafter, a pad layer 555 may be formed on the channel structure CH. The pad layer 555 may be doped to include a semiconductor material doped with a second conductivity type impurity.

After the channel structure CH is formed, an upper portion of the channel structure CH above a boundary line CL may be removed by applying a CMP process. This is only illustrative, and a height level of the boundary line CL may be different, according to embodiments. Therefore, a shape of remaining channel structure may be modified. A first interlayer insulating layer may be formed in the removed upper portion above the boundary line CL, to follow an operation in the manufacturing process illustrated in FIG. 10B.

Figure 11E:
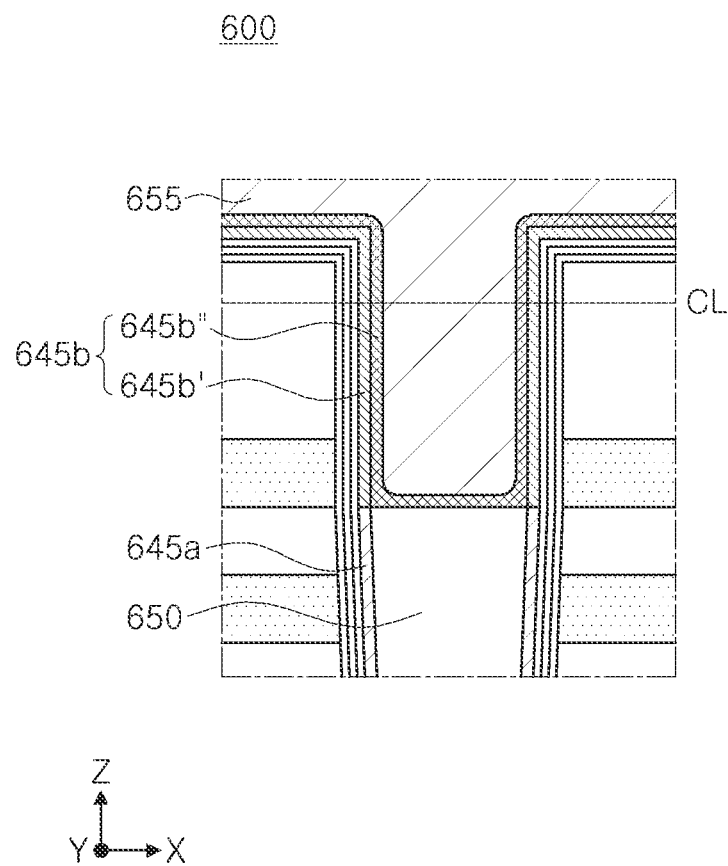

A semiconductor device 600 illustrated in FIG. 11E may represent a state during the manufacturing process of the semiconductor device 600 illustrated in FIG. 8. In a similar manner to the operation in the manufacturing process of the semiconductor device 100 illustrated in FIG. 11A, first channel layers 645a and 645b' may be formed in a channel structure CH, and a channel insulating layer 650 may be formed to fill a channel hole.

In a semiconductor device 600 according to some embodiments of the present inventive concept, in a similar manner to the semiconductor device 400 illustrated in FIG. 11C, a second channel layer 645b" may be additionally formed on at least a portion of side surfaces of the first channel layers 645a and 645b' on the channel insulating layer 650. The second channel layer 645b" may extend on a top surface of the channel insulating layer 650.

The first channel layers 645a and 645b' and the second channel layer 645b" may be divided into a first channel region 645a and a second channel region 645b according to a doping state of a semiconductor material. For example, the second channel region 645b may be doped to include a semiconductor material doped with a first conductivity type impurity.

Thereafter, a pad layer 655 may be formed on the channel structure CH. The pad layer 655 may be doped to include a semiconductor material doped with a second conductivity type impurity.

After the channel structure CH is formed, an upper portion of the channel structure CH above a boundary line CL may be removed by applying a CMP process. A first interlayer insulating layer may be formed in the removed upper portion above the boundary line CL, to follow an operation in the manufacturing process illustrated in FIG. 10B.

Figure 11F:
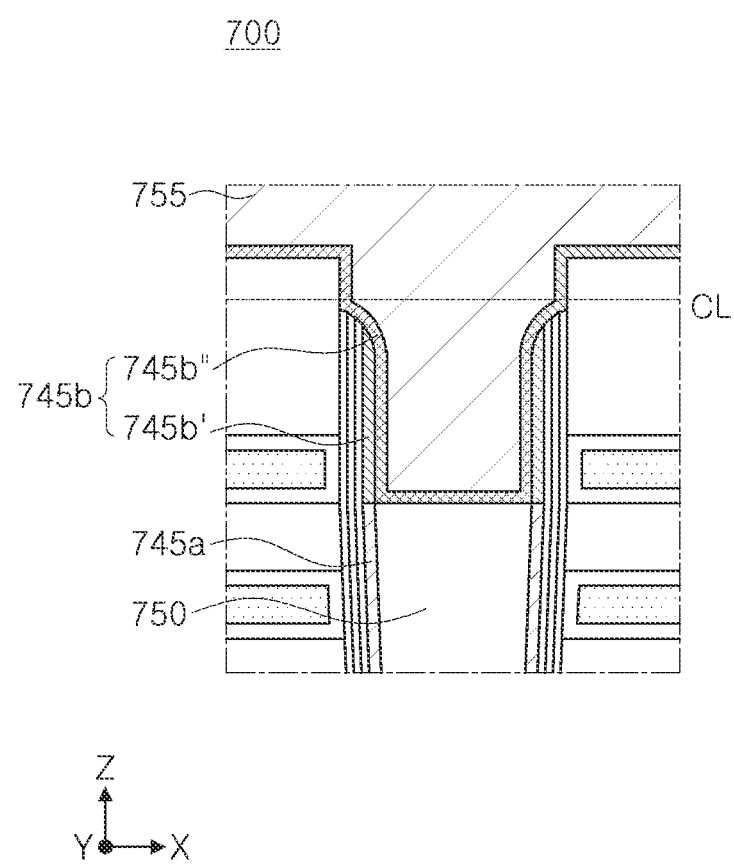

A semiconductor device 700 illustrated in FIG. 11F may represent a state during the manufacturing process of the semiconductor device 700 illustrated in FIG. 9. In a similar manner to the operation in the manufacturing process of the semiconductor device 100 illustrated in FIG. 11A, first channel layers 745a and 745b' may be formed in a channel structure CH, and a channel insulating layer 750 may be formed to fill a channel hole.

An etch-back process may be performed, in a similar manner to the semiconductor device 300 illustrated in FIG. 11B. The first channel region 745a and a portion of a gate dielectric layer may be removed together by an etch-back process.

In a semiconductor device 700 according to some embodiments of the present inventive concept, in a similar manner to the semiconductor device 400 illustrated in FIG. 11C, a second channel layer 745b" may be additionally formed on the channel insulating layer 750, on upper and side surfaces of the first channel layers 745a and 745b', and on at least a portion of an upper surface of the gate dielectric layer. In addition, the first channel layers 745a and 745b' and the second channel layer 745b" may be divided into a first channel region 745a, and a second channel region 745b including a p-type semiconductor material.

Thereafter, a pad layer 755 may be formed on the channel structure CH. The pad layer 755 may be doped to include a semiconductor material doped with a second conductivity type impurity.

After the channel structure CH is formed, an upper portion of the channel structure CH above a boundary line CL may be removed by applying a CMP process. This is only illustrative, and a height level of the boundary line CL may be different, according to embodiments. Therefore, a shape of remaining channel structure may be modified. A first interlayer insulating layer may be formed in the removed upper portion above the boundary line CL, to follow an operation in the manufacturing process illustrated in FIG. 10B.

In a semiconductor device according to some embodiments of the present inventive concept, an erase gate electrode and a pad layer, arranged in an uppermost portion of gate electrodes, may horizontally overlap each other to increase a tunneling area. In addition, at least a portion of a channel layer may be doped with a first conductivity type impurity and the pad layer may be doped with a second conductivity type impurity, to minimize impurity diffusion and improve a tunneling effect. Therefore, in a semiconductor device according to some embodiments of the present inventive concept, during an erase operation, holes may be smoothly supplied into channel structures to improve efficiency of a GIDL current.

Various advantages and effects of the present inventive concept are not limited to the above description, and will be more easily understood in the course of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   gate electrodes spaced apart from each other on a substrate and stacked in a direction perpendicular to an upper surface of the substrate;
   insulating layers alternately stacked with the gate electrodes; and
   channel structures that extend through the gate electrodes and the insulating layers, wherein ones of the channel structures comprise a channel insulating layer, a pad layer on the channel insulating layer, and a channel layer on a side surface of the channel insulating layer and on at least a portion of a side surface of the pad layer, wherein the channel layer comprises a first channel region and a second channel region, wherein a length of the second channel region in the direction perpendicular to the upper surface of the substrate is shorter than a length of the first channel region in the direction perpendicular to the upper surface of the substrate, wherein the second channel region is adjacent to the pad layer and is adjacent to a first erase gate electrode that is a farthest one of the gate electrodes from the substrate, wherein the second channel region comprises a semiconductor material doped with a first conductivity type impurity, the first channel region comprises a semiconductor material having an impurity concentration lower than an impurity concentration in the second channel region, and the pad layer comprises a semiconductor material doped with a second conductivity type impurity that is different from the first conductivity type impurity, wherein the second channel region and the pad layer are configured to form a P-N junction therebetween, and wherein a height level of a lower surface of the second channel region is lower than a height level of a lower surface of the first erase gate electrode.

2. The semiconductor device of claim 1, wherein the second channel region comprises a semiconductor material doped with a p-type impurity, and the pad layer comprises a semiconductor material doped with an n-type impurity.

3. The semiconductor device of claim 1, wherein the impurity concentration in the second channel region is equal to or higher than an impurity concentration in the pad layer.

4. The semiconductor device of claim 1, wherein at least a portion of the pad layer overlaps the first erase gate electrode in a direction parallel to the upper surface of the substrate.

5. The semiconductor device of claim 1, wherein the second channel region is on the first channel region, and at least a portion of the pad layer is on the second channel region.

6. The semiconductor device of claim 1, wherein the gate electrodes further comprise a second erase gate electrode that is closer to the substrate than the first erase gate electrode.

7. The semiconductor device of claim 6, wherein a height level of the lower surface of the second channel region with respect to the substrate is equal to or lower than a height level of a lower surface of the second erase gate electrode with respect to the substrate.

8. The semiconductor device of claim 1, wherein at least a portion of the second channel region is between the first channel region and the pad layer in a direction parallel to the upper surface of the substrate.

9. The semiconductor device of claim 8, wherein at least a portion of the pad layer is on the second channel region.

10. The semiconductor device of claim 1, wherein a length of the second channel region in the direction perpendicular to the upper surface of the substrate is greater than a thickness of the first erase gate electrode in the direction perpendicular to the upper surface of the substrate.

11. The semiconductor device of claim 1, wherein a height level of the lower surface of the second channel region with respect to the substrate is equal to a height level of an upper surface of the channel insulating layer with respect to the substrate.

12. The semiconductor device of claim 1, wherein the second channel region overlaps at least a portion of the side surface of the pad layer and a lower surface of the pad layer.

13. The semiconductor device of claim 12, wherein at least a portion of the pad layer is on the second channel region.

14. The semiconductor device of claim 12, wherein a thickness of the second channel region in a direction parallel to the upper surface of the substrate is greater than a thickness of the first channel region in the direction parallel to the upper surface of the substrate.

15. The semiconductor device of claim 1, wherein the second channel region is in contact with the pad layer to form a contact region, and wherein the P-N junction is in the contact region.

16. A semiconductor device comprising:

gate electrodes spaced apart from each other on a substrate and stacked in a direction perpendicular to an upper surface of the substrate; and channel structures that extend through the gate electrodes, wherein ones of the channel structures comprise a channel insulating layer, a pad layer on the channel insulating layer, and a channel layer on a side surface of the channel insulating layer and on at least a portion of a side surface of the pad layer, wherein the channel layer comprises a first channel region on the side surface of the channel insulating layer, and a second channel region on the first channel region, wherein the second channel region is adjacent to a first erase gate electrode that is a farthest one of the gate electrodes from the substrate, wherein the second channel region overlaps at least a portion of the side surface of the pad layer, wherein the second channel region comprises a semiconductor material doped with a first conductivity type impurity, the first channel region comprises a semiconductor material having an impurity concentration lower than an impurity concentration in the second channel region, and the pad layer comprises a semiconductor material doped with a second conductivity type impurity that is different from the first conductivity type impurity, and wherein the second channel region and the pad layer are configured to form a P-N junction therebetween.

17. The semiconductor device of claim 16, wherein a height level of a lower surface in the second channel region is lower than a height level of a lower surface of the first erase gate electrode.

18. The semiconductor device of claim 16, wherein the second channel region comprises a first p-type semiconductor region and a second p-type semiconductor region having an impurity concentration different from an impurity concentration of the first p-type semiconductor region.

19. The semiconductor device of claim 18, wherein the first p-type semiconductor region is on an upper surface of the first channel region, and wherein the second p-type semiconductor region is on at least a portion of an upper surface of the channel insulating layer and a side surface of the first p-type semiconductor region.

20. A semiconductor device comprising:

gate electrodes spaced apart from each other on a substrate and stacked in a first direction perpendicular to an upper surface of the substrate;

a conductive layer between the substrate and the gate electrodes;

channel structures extending in the first direction, that extend through the gate electrodes, and extend into at least a portion of the substrate; and a separation region that extends through the gate electrodes and extends in the first direction, wherein ones of the channel structures comprise a channel insulating layer, a pad layer on the channel insulating layer, and a channel layer on a side surface of the channel insulating layer and on at least a portion of a side surface of the pad layer, wherein the conductive layer is in contact with the channel layer of the ones of the channel structures in a direction parallel to the upper surface of the substrate, wherein the channel layer comprises a first channel region and a second channel region overlapping at least a portion of the pad layer in a direction parallel to the upper surface of the substrate, wherein the second channel region comprises a first conductivity type impurity and the pad layer comprises a second conductivity type impurity, wherein the second channel region is in contact with the pad layer to form a P-N junction between the second channel region and the pad layer, and wherein at least a portion of the second channel region overlaps an erase gate electrode that is in an uppermost portion of the gate electrodes in a direction parallel to the upper surface of the substrate.

* * * * *